(12) United States Patent
Kang

(10) Patent No.: US 12,381,184 B2
(45) Date of Patent: Aug. 5, 2025

(54) SEMICONDUCTOR PACKAGE

(71) Applicant: Samsung Electronics Co., Ltd., Suwon-si (KR)

(72) Inventor: Hyemi Kang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 424 days.

(21) Appl. No.: 17/673,024

(22) Filed: Feb. 16, 2022

(65) Prior Publication Data

US 2023/0005885 A1  Jan. 5, 2023

(30) Foreign Application Priority Data

Jul. 1, 2021 (KR) .................. 10-2021-0086706

(51) Int. Cl.
*H01L 25/065* (2023.01)
*H01L 23/00* (2006.01)

(52) U.S. Cl.
CPC .......... *H01L 25/0657* (2013.01); *H01L 24/08* (2013.01); *H01L 24/09* (2013.01);
(Continued)

(58) Field of Classification Search
CPC ..... H01L 25/0657; H01L 24/08; H01L 24/09; H01L 24/43; H01L 24/48; H01L 24/32;
(Continued)

(56) References Cited

U.S. PATENT DOCUMENTS 8,368,197 B2  2/2013  Kook
9,224,682 B2  12/2015  Nakayama
(Continued)

FOREIGN PATENT DOCUMENTS

JP    2002026239 A    1/2002
KR   1020090113679 A  11/2009
KR   1020200033020 A   3/2020

*Primary Examiner* — Jasmine J Clark
(74) *Attorney, Agent, or Firm* — Muir Patent Law, PLLC

(57) ABSTRACT

A semiconductor package includes a package substrate having a first side portion adjacent to a first edge, and a second side portion adjacent to a second edge opposite the first edge; a plurality of first substrate pads on the package substrate at the first side portion of the package substrate; a first chip on the package substrate; a second chip stacked on the first chip in a step-wise manner to result in a first exposure region exposing a portion of a surface of the first chip with respect to the second chip due to the step-wise stacking, the first exposure region being adjacent to a first edge of the first chip; a plurality of first bonding pads on a first portion of the first exposure region, the first portion of the first exposure region being adjacent to the first edge of the first chip; a plurality of second bonding pads on a second portion of the first exposure region, the second portion of the first exposure region further from the first edge of the first chip than the first portion of the first exposure region is to the first edge of the first chip, the plurality of second bonding pads being electrically insulated from any circuit components in the first chip; a plurality of third bonding pads on a surface of the second chip; and a plurality of bonding wires electrically connecting the third bonding pads to the first substrate pads via the second bonding pads.

20 Claims, 26 Drawing Sheets

(52) U.S. Cl.
CPC .............. *H01L 24/32* (2013.01); *H01L 24/48* (2013.01); *H01L 2224/0801* (2013.01); *H01L 2224/08054* (2013.01); *H01L 2224/08055* (2013.01); *H01L 2224/08057* (2013.01); *H01L 2224/0903* (2013.01); *H01L 2224/09051* (2013.01); *H01L 2224/09103* (2013.01); *H01L 2224/09132* (2013.01); *H01L 2224/09133* (2013.01); *H01L 2224/09151* (2013.01); *H01L 2224/09153* (2013.01); *H01L 2224/09177* (2013.01); *H01L 2224/09515* (2013.01); *H01L 2224/32145* (2013.01); *H01L 2224/32225* (2013.01); *H01L 2224/48105* (2013.01); *H01L 2224/48149* (2013.01); *H01L 2224/48229* (2013.01); *H01L 2225/06506* (2013.01); *H01L 2225/0651* (2013.01); *H01L 2225/06524* (2013.01); *H01L 2225/06562* (2013.01); *H01L 2225/06568* (2013.01); *H01L 2924/1431* (2013.01); *H01L 2924/1434* (2013.01)

(58) Field of Classification Search
CPC . H01L 2224/48091; H01L 2224/73265; H01L 2924/15311; H01L 2924/181; H10B 80/00
USPC ......................................................... 257/777
See application file for complete search history.

(56) References Cited

U.S. PATENT DOCUMENTS

| | | |
|---|---|---|
| 10,262,962 B2 | 4/2019 | Monma |
| 10,483,239 B2 | 11/2019 | Yan et al. |
| 10,903,189 B2 | 1/2021 | Do |
| 2009/0309205 A1* | 12/2009 | Takahashi ........... H01L 25/0657 257/E23.116 |
| 2010/0109141 A1* | 5/2010 | Nishiyama .............. H01L 24/49 257/E23.141 |
| 2018/0122789 A1* | 5/2018 | Kang ..................... H01L 24/48 |

* cited by examiner

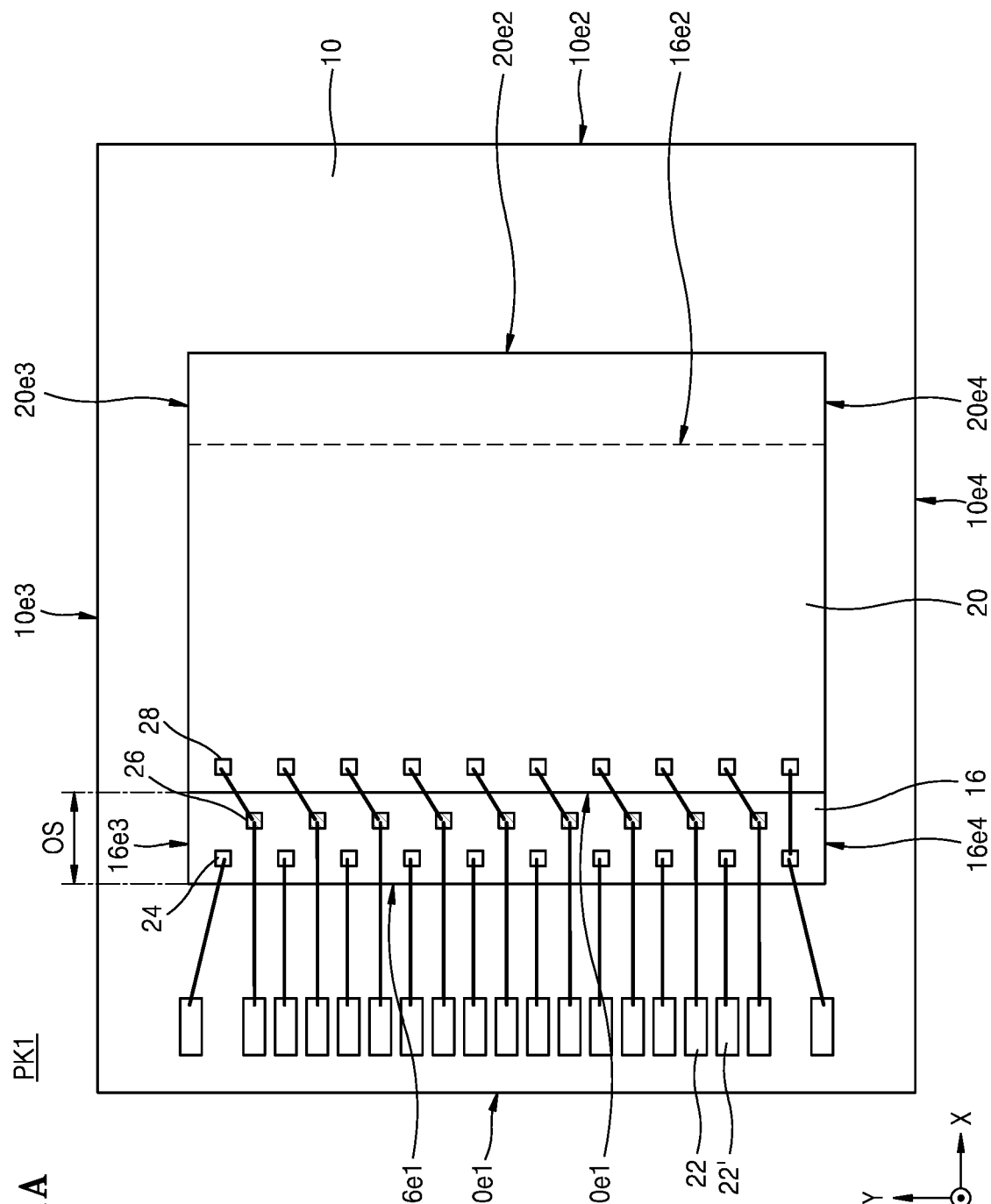

SEMICONDUCTOR PACKAGE

CROSS-REFERENCE TO RELATED APPLICATION

This application is based on and claims priority under 35 U.S.C. § 119 to Korean Patent Application No. 10-2021-0086706, filed on Jul. 1, 2021, in the Korean Intellectual Property Office, the disclosure of which is incorporated by reference herein in its entirety.

BACKGROUND

The inventive concept relates to semiconductor packages, and more particularly, to a semiconductor package of a multi-chip type including a plurality of chips.

Electronic products often require high-capacity data processing while their volumes are gradually decreased. For electronic products, a multi-chip type semiconductor package implemented as a single package by stacking a plurality of chips is advantageous.

Multi-chip type semiconductor packages may have bonding wires to electrically connect bonding pads of chips to each other. Accordingly, in multi-chip type semiconductor packages, it is important to reduce the lengths of bonding wires.

SUMMARY

Various aspects of the inventive concept provide a semiconductor package capable of reducing the length of a bonding wire that electrically connects chips to each other.

According to an aspect of the inventive concept, there is provided a semiconductor package including a plurality of substrate pads on a one side portion of a package substrate; a base chip on the package substrate; one or more stacked chips sequentially offset-stacked on the base chip, wherein a plurality of exposure regions exposing portions of respective surfaces of the base chip and the stacked chips are provided due to the offset stacking; a plurality of bonding pads on a portion of each of the exposure regions that is close to one edge of each of the base chip and the stacked chips, wherein the plurality of bonding pads include upper bonding pads over the stacked chips; a plurality of dummy bonding pads on a portion of each of the exposure regions that is far from the one edge of each of the base chip and the stacked chips, wherein the plurality of dummy bonding pads include lower dummy bonding pads under the upper bonding pads; and a plurality of bonding wires electrically connecting the upper bonding pads to the substrate pads via the lower dummy bonding pads.

According to another aspect of the inventive concept, a semiconductor package includes a package substrate having a first side portion adjacent to a first edge, and a second side portion adjacent to a second edge opposite the first edge; a plurality of first substrate pads on the package substrate at the first side portion of the package substrate; a first chip on the package substrate; a second chip stacked on the first chip in a step-wise manner to result in a first exposure region exposing a portion of a surface of the first chip with respect to the second chip due to the step-wise stacking, the first exposure region being adjacent to a first edge of the first chip; a plurality of first bonding pads on a first portion of the first exposure region, the first portion of the first exposure region being adjacent to the first edge of the first chip; a plurality of second bonding pads on a second portion of the first exposure region, the second portion of the first exposure region further from the first edge of the first chip than the first portion of the first exposure region is to the first edge of the first chip, the plurality of second bonding pads being electrically insulated from any circuit components in the first chip; a plurality of third bonding pads on a surface of the second chip; and a plurality of bonding wires electrically connecting the third bonding pads to the first substrate pads via the second bonding pads.

In some further embodiments, the second bonding pads are first relay bonding pads, and the semiconductor package includes a third chip stacked on the second chip in a step-wise manner to result in a second exposure region exposing a portion of a surface of the second chip with respect to the third chip due to the step-wise stacking; a plurality of second relay bonding pads on the surface of second chip such that the plurality of third bonding pads on the surface of the second chip and the plurality of second relay bonding pads on the surface of the second chip are on first and second portions of the second exposure region that are respectively closer to and further from a first edge of the second chip; a fourth chip stacked on the third chip in a step-wise manner to result in a third exposure region exposing a portion of a surface of the third chip with respect to the fourth chip due to the step-wise stacking; a plurality of fourth bonding pads and a plurality of third relay bonding pads on first and second portions of the third exposure region that are respectively closer to and further from a first edge of the third chip; a plurality of fifth bonding pads on a surface of the fourth chip adjacent to a first edge of the fourth chip; and a plurality of bonding wires electrically connecting the fifth bonding pads to the substrate pads, such that each fifth bonding pad is connected to a respective substrate pad via a respective third relay bonding pad, a respective second relay bonding pad, and a respective first relay bonding pad.

BRIEF DESCRIPTION OF THE DRAWINGS

Exemplary embodiments of the inventive concept will be more clearly understood from the following detailed description taken in conjunction with the accompanying drawings in which:

FIGS. 1A and 1B are plan views of a semiconductor package according to an embodiment of the inventive concept;

DETAILED DESCRIPTION OF THE EMBODIMENTS

The inventive concept will now be described more fully with reference to the accompanying drawings, in which exemplary embodiments of the inventive concept are shown. One embodiment may be implemented, or a plurality of embodiments may be combined and implemented. However, the inventive concept is not limited to these embodiments.

In the present specification, the drawings are exaggerated in order to more clearly explain the inventive concept.

Figure 1B:
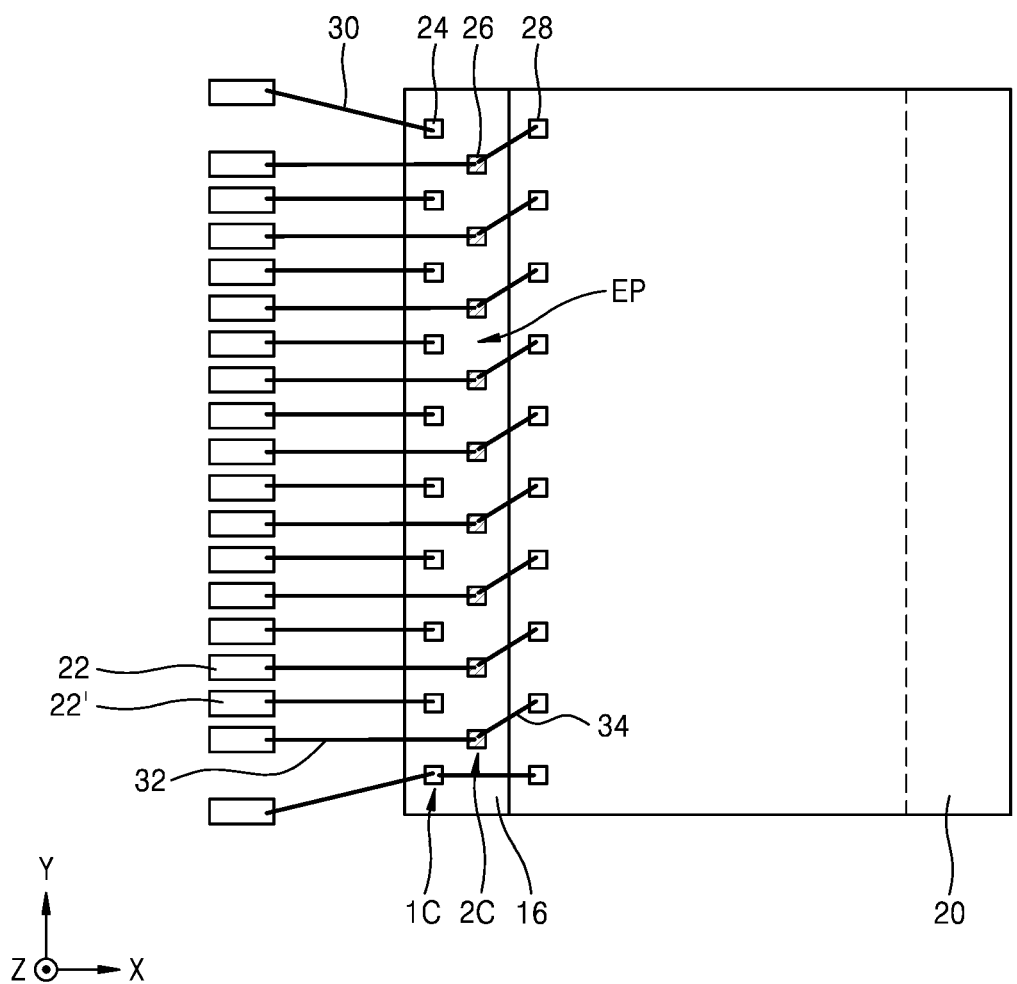
Figure 2:
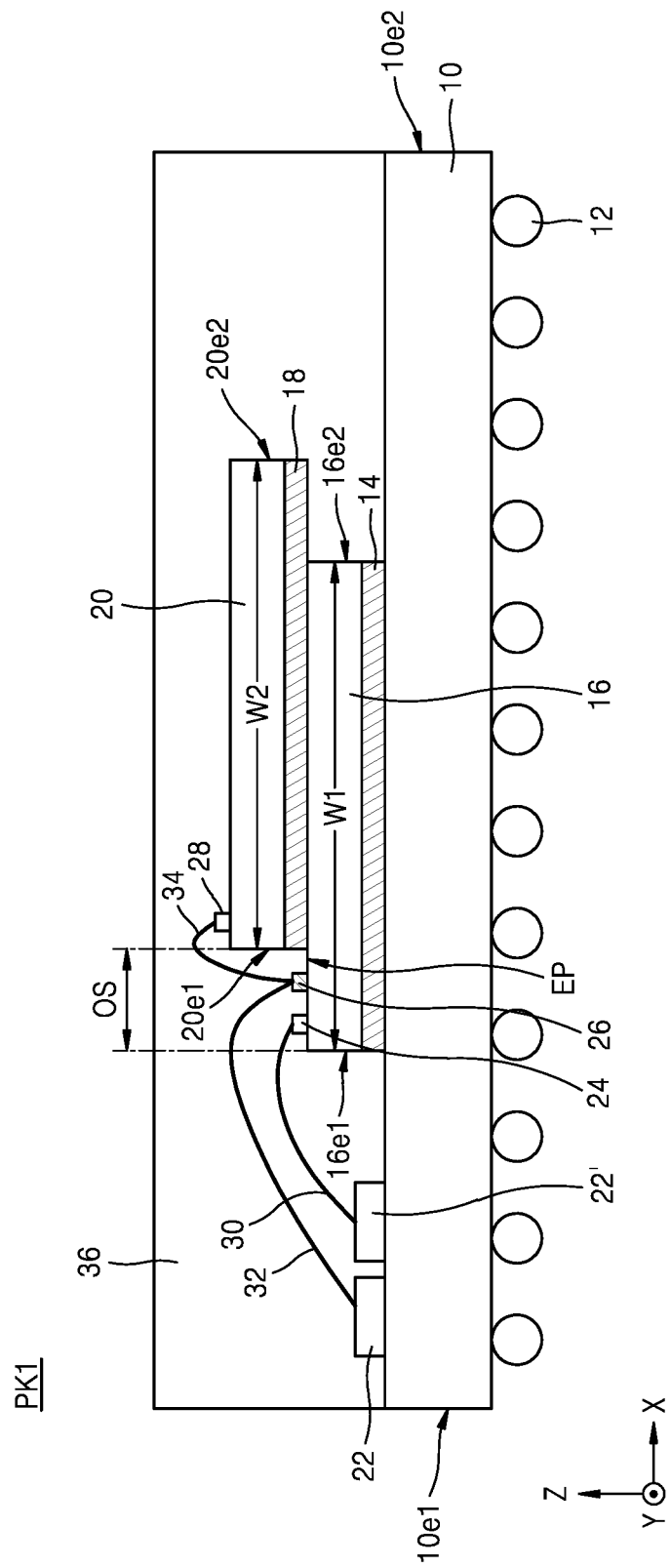
FIG. 2 is a cross-sectional view of the semiconductor package of FIGS. 1A and 1B according to an embodiment of the inventive concept.

FIGS. 1A and 1B are plan views for explaining a semiconductor package PK1 according to an embodiment of the inventive concept, and FIG. 2 is an example cross-sectional view of the semiconductor package PK1 of FIGS. 1A and 1B.

In detail, the semiconductor package PK1 includes a package substrate 10, and substrate pads 22 and 22' provided on one side portion of the package substrate 10, for example, adjacent to one edge of the package substrate 10 from a plan view. The substrate pads 22 and 22' may be on a first surface of the package substrate 10 (e.g., a top surface). External connection terminals 12, for example, solder balls, may be provided below the package substrate 10, e.g., on a second surface of the package substrate 10, such as a bottom surface. In the drawings below, an X-axis direction and a Y-axis direction are directions parallel to the surface of the package substrate 10. The X-axis direction and the Y-axis direction may be perpendicular to each other and may be described as horizontal directions.

The Y-axis direction may denote a first direction for convenience of explanation, and the X-axis direction may be referred to as a second direction for convenience of explanation. A Z-axis direction is a direction perpendicular to the surface of the package substrate 10. The Z-axis direction may be a direction perpendicular to an X-Y plane, and may be described as a vertical direction.

The package substrate 10 may be a printed circuit board (PCB). The package substrate 10 may include a first edge portion 10e1, a second edge portion 10e2, a third edge portion 10e3, and a fourth edge portion 10e4. Each of the first edge portion 10e1, second edge portion 10e2, third edge portion 10e3, and fourth edge portion 10e4 may include or be located at a side surface of the package substrate 10.

The substrate pads 22 and 22' may be located near (e.g., adjacent to) the first edge portion 10e1, which is one side of the package substrate 10. The substrate pads 22 and 22' may be referred to as substrate bonding pads. The substrate pads 22 and 22' may be included in plural, and may be located apart from each other in the Y-axis direction. As used herein, items described using the singular forms "a", "an" and "the" may be provided in plural, unless the context clearly indicates otherwise.

The semiconductor package PK1 may include a first chip 16 and a second chip 20. The first chip 16 may be mounted on the package substrate 10. The first chip 16 may be a base chip mounted on the package substrate 10. The first chip 16 may be attached onto the package substrate 10 with a first adhesive layer 14 therebetween. The first chip 16 may include a first edge portion 16e1, a second edge portion 16e2, a third edge portion 16e3, and a fourth edge portion 16e4. Each of the first edge portion 16e1, second edge portion 16e2, third edge portion 16e3, and fourth edge portion 16e4 may include or may be formed at a side surface of the first chip 16. The first chip 16 may have a first width W1 in the X-axis direction.

The first chip 16 may be a logic chip or a memory chip, formed of an integrated circuit formed on a semiconductor die. According to an embodiment, the logic chip may be a memory controller chip, a central processing unit (CPU) chip, a graphics processing unit (GPU) chip, or an application processor (AP) chip.

According to an embodiment, the memory chip may be a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip.

The second chip 20 may be stacked on the first chip 16 in an offset manner. The second chip 20 may be a stacked chip stacked on the first chip 16. The second chip 20 may be stacked on the first chip 16 in a cascade type, namely, in a staircase type, and may overhang beyond the first chip 16 on one side and form a step with the first chip 16 at an opposite side. In this manner the first chip 16 and second chip 20 are stacked in a step-wise manner. The second chip 20 may be attached onto the first chip 16 with a second adhesive layer 18 therebetween. The second chip 20 may include a first edge portion 20e1, a second edge portion 20e2, a third edge portion 20e3, and a fourth edge portion 20e4. Each of the first edge portion 20e1, second edge portion 20e2, third edge portion 20e3, and fourth edge portion 20e4 may include or may be formed at a side surface of the second chip 20. The second chip 20 may be the same kind or a different kind of chip as or from the first chip 16.

The second chip 20 may be offset on the first chip 16 by an offset length OS in the X-axis direction. An exposure region EP exposing a portion of the surface of the first chip 16 may be provided according to an offset stacking manner. The second chip 20 may have a second width W2 in the X-axis direction. The first width W1 may be identical to the second width W2, though it is not limited thereto and may be different from the second width W2.

The semiconductor package PK1 may include a plurality of first bonding pads 24 and a plurality of dummy bonding pads 26. The first bonding pads 24 may be arranged on a portion of the exposure region EP that is relatively closer to the first edge portion 16e1, which is at one side of the first chip 16. The first bonding pads 24 may be chip pads (e.g., chip select pads) or signal pads on the first chip 16 (e.g., for transmitting or receiving voltages or signals to or from the first chip 16). The first bonding pads 24 may be electrically connected to circuit devices in the first chip 16 so that they transmit or receive voltages or signals to or from the circuit devices.

The first bonding pads 24 may be driving pads for driving the first chip 16. As shown in FIGS. 1A and 1B, the first bonding pads 24 may be arranged apart from each other in the Y-axis direction on a first row 1C along the first edge portion 16e1, which is at one side of the first chip 16. Bonding pads, as described herein, refer to electrically conductive pads used to bond to wires or other electrically conductive components. Bonding pads may have a flat external surface on which wires are bonded, and may be formed of a conductive material such as a metal.

The dummy bonding pads 26 may be arranged on a portion of the exposure region EP that is further from the first edge portion 16e1, which is at one side of the first chip 16. The dummy bonding pads 26 may be located farther from the first edge portion 16e1 than the first bonding pads 24 are. The dummy bonding pads 26 may be first dummy pads on the first chip 16. The dummy bonding pads 26 may not be electrically connected to the circuit devices in the first chip 16. The first bonding pads 24 may be referred to as outer bonding pads, since they are closer to an outer edge of the first chip 16, while the dummy bonding pads 26 may be referred to as inner bonding pads as they are closer to a center of the first chip 16 than the first bonding pads 24. Alternatively, the first bonding pads 24 may be referred to as "chip-connected" bonding pads, as they are connected to circuit devices in the first chip 16, and the dummy bonding pads 26 may be referred to as "relay" bonding pads, as they relay signals and voltages between the package substrate 10 and a chip beyond the chip they are disposed on. The dummy bonding pads 26 may be disposed on an electrically insulative layer of the first chip 16, so that they are not electrically connected to (e.g., are electrically insulated from) any circuit devices of the first chip 16. The dummy bonding pads 26 may also be simply referred to as second bonding pads in some cases. Accordingly, ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

As shown in FIGS. 1A and 1B, the dummy bonding pads 26 may be arranged apart from each other in the Y-axis direction on a second row 2C along the first edge portion 16e1, which is at one side of the first chip 16. The second row 2C is spaced apart from the first row 1C in the X-axis direction perpendicular to the Y-axis direction.

The dummy bonding pads 26 may be arranged between the first bonding pads 24 in a direction along the Y-axis (e.g., when viewed from the X-axis direction). In FIGS. 1A, 1B, and 2, the dummy bonding pads 26 may be all arranged between the first bonding pads 24 in the Y-axis direction (e.g., each dummy bonding pad 26 is arranged between two first bonding pads 24 when viewed from the X-axis direction). For example, each dummy bonding pad 26 may be arranged between two adjacent first bonding pads 24 in the Y-axis direction, but not overlap the two adjacent first bonding pads 24 in the Y-axis direction. However, in some embodiments, some of the dummy bonding pads 26 may not be arranged between two of the first bonding pads 24 in the Y-axis direction. The dummy bonding pads 26 are not aligned with the first bonding pads 24 in the X-axis direction. A layout relationship between the first bonding pads 24 and the dummy bonding pads 26 will be described in more detail later.

The semiconductor package PK1 may include a plurality of second bonding pads 28 (which may be described as "third" bonding pads in relation to other named pads, but also may be described as "first" bonding pads depending on the context and what is being described). The second bonding pads 28 may be formed on a surface of the second chip 20. The second bonding pads 28 may be chip pads (e.g., chip select pads) or signal pads on the second chip 20 (e.g., for transmitting or receiving voltages or signals to or from the second chip 20). The second bonding pads 28 may be electrically connected to circuit devices in the second chip 20 so that they transmit or receive voltages or signals to or from the circuit devices.

As shown in FIGS. 1A and 1B, the second bonding pads 28 may be arranged apart from each other in the Y-axis direction along the first edge portion 20e1, which is at one side of the second chip 20. In FIGS. 1A and 1B, the second bonding pads 28 are aligned with the first bonding pads 24 in the X-axis direction. However, in some cases, the second bonding pads 28 may not be aligned with the first bonding pads 24 in the X-axis direction. The second bonding pads 28 comprise upper bonding pads of bonding wire-connected pads of the stacked chips. In this case, the dummy bonding pads 26 comprise lower bonding pads of wire-connected pads, located a lower height (e.g., above the package substrate 10) than upper bonding pads to which they are connected. For example, for a particular individual pair of pads connected to a bonding wire, a dummy bonding pad 26 may be a lower bonding pad of the pair, and a second bonding pad 28 may be an upper bonding pad of the pair. A plurality of bonding wires (e.g., 32 and 34) electrically connect the upper bonding pads to the substrate pads via the lower bonding pads.

The semiconductor package PK1 may include bonding wires 30, 32, and 34. The bonding wires 30, 32, and 34 may electrically connect the first chip 16, the second chip 20, and the package substrate 10 to one another. As shown in FIGS. 1B and 2, the bonding wires 30, 32, and 34 may include first bonding wires 30 for connecting the first bonding pads 24 of the first chip 16 to the substrate pads 22', second bonding wires 32 for connecting the dummy bonding pads 26 of the first chip 16 to the substrate pads 22, and third bonding wires 34 for connecting the second bonding pads 28 of the second chip 20 to the dummy bonding pads 26 of the first chip 16.

In FIGS. 1A and 1B, the second bonding pads 28 of the second chip 20 and the dummy bonding pads 26 of the first chip 16 are all connected to each other by the third bonding wires 34. However, in some cases, only some of the second bonding pads 28 of the second chip 20 may be connected to the dummy bonding pads 26 of the first chip 16. For convenience of explanation, FIG. 2 illustrates that the substrate pad 22 and the substrate pad 22' are spaced apart from each other in the X-axis direction, but as shown in FIGS. 1A and 1B, in at least one embodiment, substrate pads 22 and substrate pads 22' are aligned in the Y-axis direction and are not spaced apart from each other in the X-axis direction.

The semiconductor package PK1 may include the bonding wires 32, 34 electrically connecting the second bonding pads 28 to the substrate pads 22 through the dummy bonding pads 26. In the semiconductor package PK1, each of the bonding wires 32, 34 electrically connecting the second bonding pads 28 to the substrate pads 22 through the dummy bonding pads 26 may not be long (e.g., may be shorter than if a bonding wire were connected directly from the substrate pads 22 to the second bonding pads 28).

Accordingly, as the lengths of the bonding wires 32 and 34 decrease, the semiconductor package PK1 may provide a high signal processing speed between the first and second chips 16 and 20 and may have a reduced total thickness. In addition, the semiconductor package PK1 according to an embodiment of the inventive concept may provide a high package design freedom degree by optimizing locations of the first and second bonding pads 24 and 28 and the dummy bonding pads 26 and 42.

The semiconductor package PK1 may further include a molding layer 36 that seals the first chip 16, the second chip 20, the first bonding pads 24, the dummy bonding pads 26, the second bonding pads 28, and the first, second, and third bonding wires 30, 32, and 34. The molding layer 36 may be, for example, epoxy resin.

Figure 3:
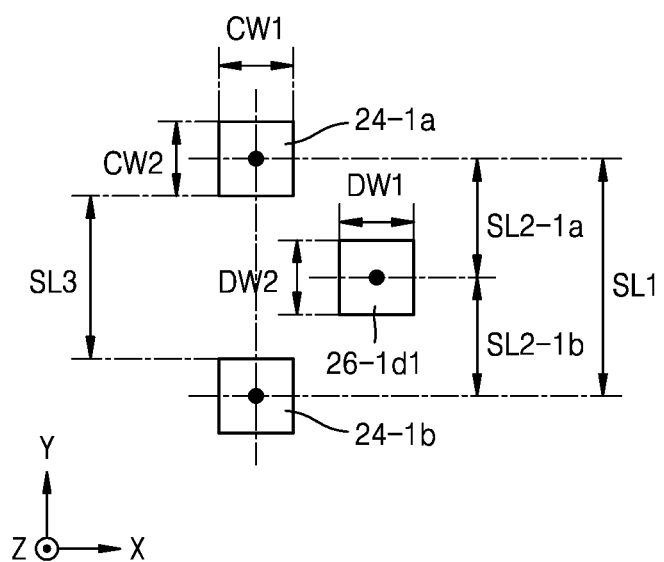
FIG. 3 is a plan view for explaining an embodiment of a layout relationship between first bonding pads and dummy bonding pads of the semiconductor package of FIGS. 1A, 1B, and 2.

FIG. 3 is a plan view for explaining an embodiment of a layout relationship between the first bonding pads and the dummy bonding pads of the semiconductor package of FIGS. 1A, 1B, and 2.

In detail, a layout plan view BPL1 may include first bonding pads 24-1a and 24-1b and a dummy bonding pad 26-1d1. The first bonding pads 24-1a and 24-1b may be some of the first bonding pads 24 shown in FIGS. 1A, 1B, and 2.

Each of the first bonding pads 24-1a and 24-1b may have a first chip width CW1 in the X-axis direction and a second chip width CW2 in the Y-axis direction (also described simply as widths). Each of the first chip width CW1 and the second chip width CW2 may be, for example, about 40 micrometers (μm) to about 70 μm. Each of the first bonding pads 24-1a and 24-1b may have a rectangular shape. For example, in one embodiment, each of the first bonding pads 24-1a and 24-1b are square shaped from a plan view to have four same-length sides. The first bonding pads 24-1a and 24-1b may be located apart from each other in the Y-axis direction. The first bonding pads 24-1a and 24-1b may have a first separation distance SL1 between their center points in the Y-axis direction. The first separation distance SL1 may be, for example about 84 μm to about 180 μm.

The dummy bonding pad 26-1d1 may be one of the dummy bonding pads 26 shown in FIGS. 1A, 1B, and 2. The dummy bonding pad 26-1d1 may have a first dummy width DW1 in the X-axis direction and a second dummy width DW2 in the Y-axis direction (also described simply as widths). In some embodiments, the first dummy width DW1 and the second dummy width DW2 may be equal to the first chip width CW1 and the second chip width CW2, respectively. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

According to some embodiments, each of the first dummy width DW1 and the second dummy width DW2 may be less than the first chip width CW1 and the second chip width CW2, respectively. For example, each of the first dummy width DW1 and the second dummy width DW2 may be about 30 μm to about 60 μm in some embodiments. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The dummy bonding pad 26-1d1 may be arranged between the first bonding pads 24-1a and 24-1b in the Y-axis direction (e.g., when viewed from the X-axis direction). For example, the dummy bonding pad 26-1d1 is not aligned with either of the first bonding pads 24 in the X-axis direction. The first bonding pad 24-1a and the dummy bonding pad 26-1d1 may have a first sub separation distance SL2-1a (e.g., in the Y-axis direction) between their center points.

The first bonding pad 24-1b and the dummy bonding pad 261d-1 may have a second sub separation distance SL2-1b (e.g., in the Y-axis direction) between their center points. The first sub separation distance SL2-1a and the second sub separation distance SL2-1b may have the same values. Each of the first sub separation distance SL2-1a and the second sub separation distance SL2-1b may be, for example, about 42 μm to about 90 μm.

The first bonding pads 24-1a and 24-1b are spaced apart from each other by a third distance SL3 in the Y-axis direction. The first bonding pads 24-1a and 24-1b have the third distance SL3 between their closest edge portions in the Y-axis direction. The third distance SL3 may be, for example, about 44 um to about 110 um.

As such, in the semiconductor package PK1 of FIGS. 1A, 1B, and 2 according to an embodiment of the inventive concept, the dummy bonding pad 26-1d1 may be easily arranged between, but not aligned with, the first bonding pads 24-1a and 24-1b in the Y-axis direction. For example, the dummy bonding pad 26-1d1 may not overlap the first bonding pads 24-1a and 24-1b in the Y-axis direction.

Figure 4:
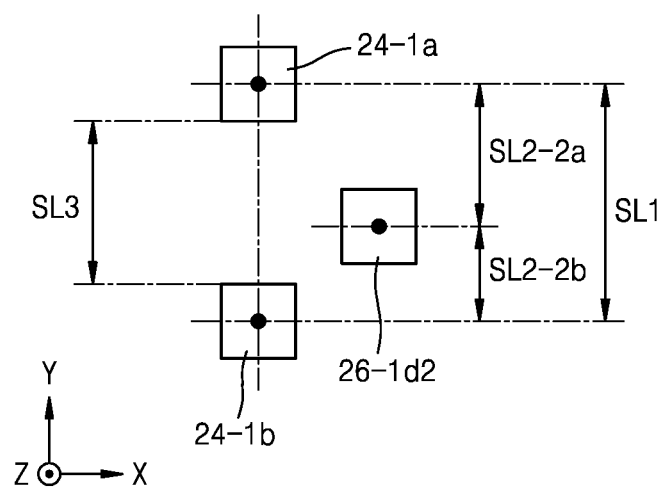
FIG. 4 is a plan view for explaining an embodiment of a layout relationship between first bonding pads and dummy bonding pads of the semiconductor package of FIGS. 1A, 1B, and 2.

FIG. 4 is a plan view for explaining an embodiment of a layout relationship between the first bonding pads and the dummy bonding pads of the semiconductor package of FIGS. 1A, 1B, and 2.

In detail, a layout plan view BPL2 may be the same as the layout plan view BPL1 of FIG. 3 except that a dummy bonding pad 26-1d2 is arranged biased toward the first bonding pad 24-1b from among the first bonding pads 24-1a and 24-1b. The same reference numerals in FIGS. 3 and 4 denote the same elements.

The dummy bonding pad 26-1d2 may be arranged between the first bonding pads 24-1a and 24-1b in the Y-axis direction. For example, the dummy bonding pad 26-1d2 is not aligned with the first bonding pads 24 in the X-axis direction. The dummy bonding pad 26-1d2 may be arranged biased toward the first bonding pad 24-1b in the Y-axis direction (e.g., closer to the first bonding pad 24-1b than to the first bonding pad 24-1a in the Y-axis direction).

The first bonding pad 24-1a and the dummy bonding pad 261d-2 may have a first sub separation distance SL2-2a in the Y-axis direction between their center points. The first bonding pad 24-1b and the dummy bonding pad 261d-2 may have a second sub separation distance SL2-2b in the Y-axis direction between their center points. The first sub separation distance SL2-2a may be greater than the second sub separation distance SL2-2b.

In some embodiments, the first sub separation distance SL2-2a may be a maximum of 30% greater than the second sub separation distance SL2-2b. For example, the first sub separation distance SL2-2a may be about 55 μm to about 117 μm. The second sub separation distance SL2-1b may be about 31 μm to about 73 μm for any given first sub-separation distance such that the first sub separation distance SL2-2a is no more than 30% greater than the second sub separation distance SL2-2b. As such, in the semiconductor package PK1 of FIGS. 1A, 1B, and 2 according to an embodiment of the inventive concept, the dummy bonding pad 26-1d2 may be easily arranged between the first bonding pads 24-1a and 24-1b in the Y-axis direction.

Figure 5:
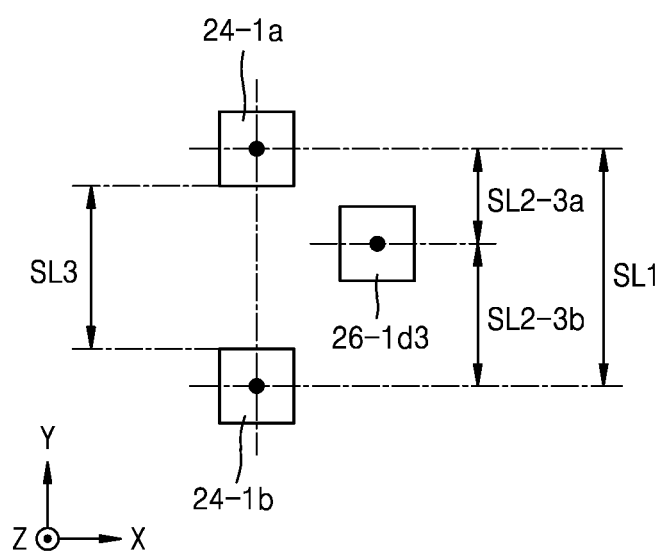
FIG. 5 is a plan view for explaining an embodiment of a layout relationship between first bonding pads and dummy bonding pads of the semiconductor package of FIGS. 1A, 1B, and 2.

FIG. 5 is a plan view for explaining an embodiment of a layout relationship between the first bonding pads and the dummy bonding pads of the semiconductor package of FIGS. 1A, 1B, and 2.

In detail, a layout plan view BPL3 may be the same as the layout plan view BPL1 of FIG. 3 except that a dummy bonding pad 26-1d3 is arranged biased toward the first bonding pad 24-1a from among the first bonding pads 24-1a and 24-1b. The same reference numerals in FIGS. 3 and 5 denote the same elements.

The dummy bonding pad 26-1d3 may be arranged between the first bonding pads 24-1a and 24-1b in the Y-axis direction. For example, the dummy bonding pad 26-1d3 is not aligned with the first bonding pads 24 in the X-axis direction. The dummy bonding pad 26-1d3 may be arranged biased toward the first bonding pad 24-1a in the Y-axis direction.

The first bonding pad 24-1a and the dummy bonding pad 26-1d3 may have a first sub separation distance SL2-3a in the Y-axis direction between their center points. The first bonding pad 24-1b and the dummy bonding pad 26-1d3 may have a second sub separation distance SL2-3b in the Y-axis direction between their center points. The first sub separation distance SL2-3a may be less than the second sub separation distance SL2-3b.

In some embodiments, the second sub separation distance SL2-3b may be a maximum of 30% greater than the first sub separation distance SL2-3a. For example, the second sub separation distance SL2-3b may be about 55 μm to about 117 μm. The first sub separation distance SL2-3a may be about 31 μm to about 73 μm. As such, in the semiconductor package PK1 of FIGS. 1A, 1B, and 2 according to an embodiment of the inventive concept, the dummy bonding pad 26-1d3 may be easily arranged between the first bonding pads 24-1a and 24-1b in the Y-axis direction. In some embodiments, the sub separation distances described in FIGS. 3-5 may be combined in different manners in one package. For example, in one package, one group of dummy bonding pads may be in the configuration depicted in FIG. 3, another group of dummy bonding pads may be in the configuration depicted in FIG. 4, and/or another group of dummy bonding pads may be in the configuration depicted in FIG. 5.

Figure 6A:
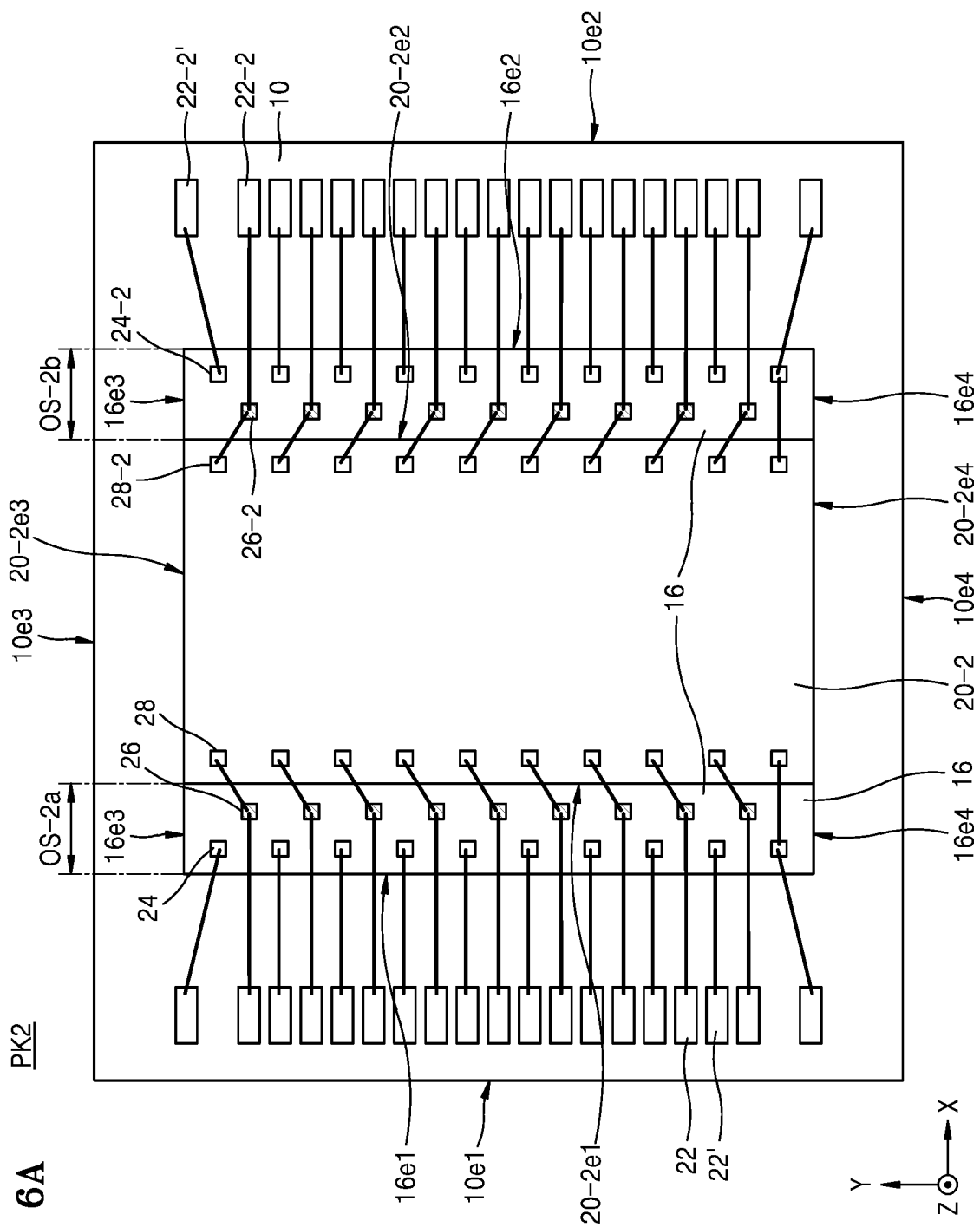
FIGS. 6A and 6B are plan views of a semiconductor package according to an embodiment of the inventive concept.
Figure 6B:
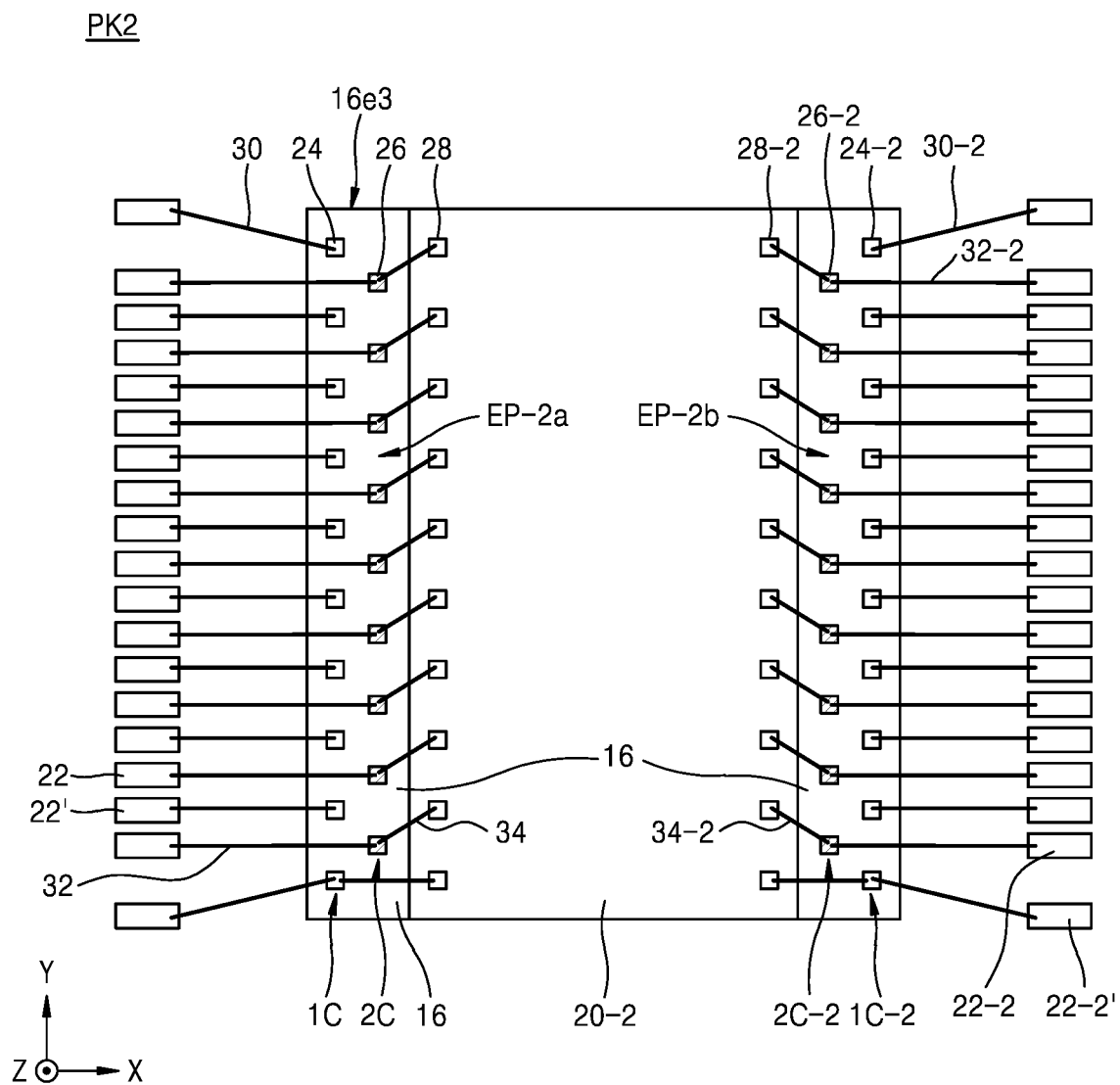
Figure 7:
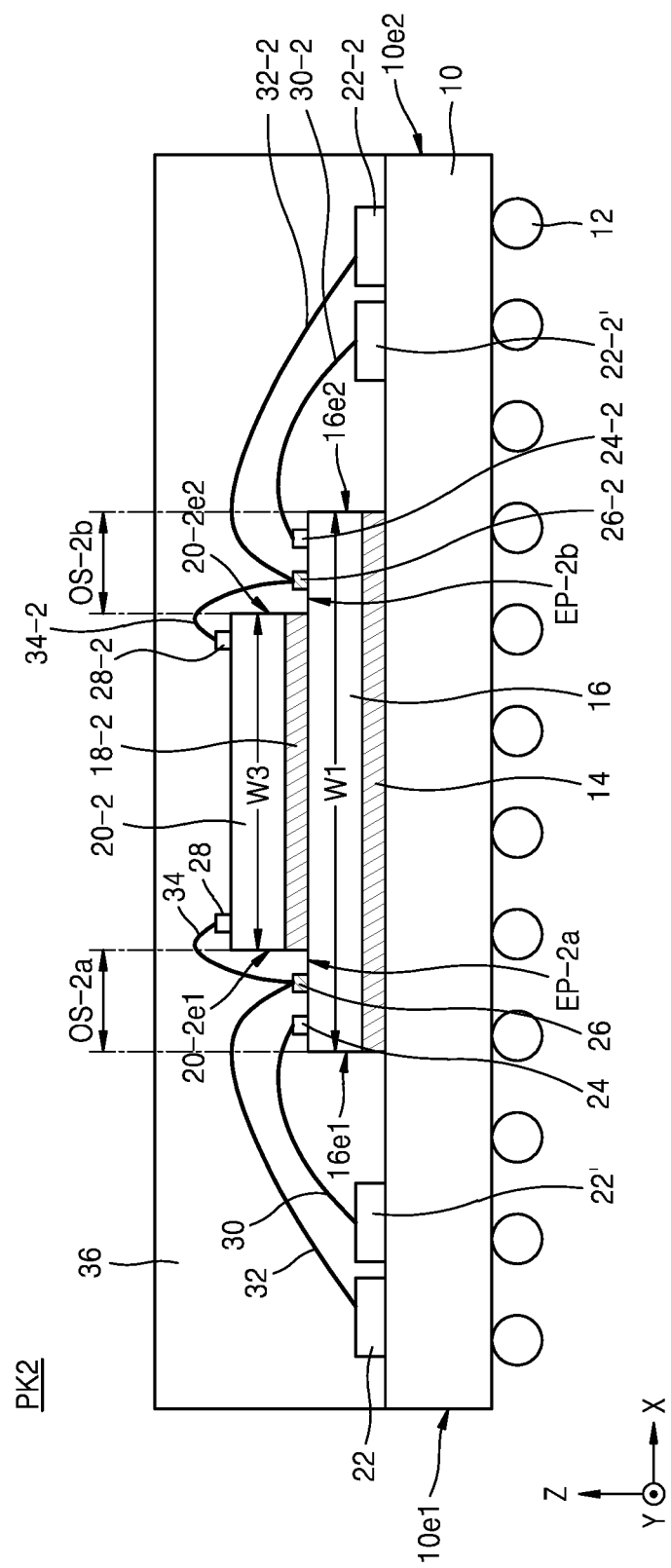
FIG. 7 is a cross-sectional view of the semiconductor package of FIGS. 6A and 6B according to an embodiment of the inventive concept.

FIGS. 6A and 6B are plan views for explaining a semiconductor package PK2 according to an embodiment of the inventive concept, and FIG. 7 is a cross-sectional view of the semiconductor package PK2 of FIGS. 6A and 6B.

In detail, the semiconductor package PK2 may be almost the same as the semiconductor package PK1 of FIGS. 1A, 1B, and 2 except that an additional exposure region EP-2b is further included in the first chip 16 and a plurality of additional bonding pads 24-2 and a plurality of additional dummy bonding pads 26-2 are further included in the additional exposure region EP-2b.

In FIGS. 6A, 6B, and 7, reference numerals similar to or the same as FIGS. 1A, 1B, and 2 indicate the same or similar members. Descriptions of FIGS. 6A, 6B, and 7 identical to those given above with reference to FIGS. 1A, 1B, and 2 are omitted or briefly given below.

The semiconductor package PK2 may include the package substrate 10, a first set of substrate pads 22 and 22' provided on a first side portion of the package substrate 10, and additional (e.g., a second set of) substrate pads 22-2 and 22-2' provided on a second, opposite side portion of the package substrate 10. The additional substrate pads 22-2 and 22-2' may be located near a second edge portion 10e2, which is the opposite side of the package substrate 10. The additional substrate pads 22-2 and 22-2' may also be referred to as a second set of substrate bonding pads. The additional substrate pads 22-2 and 22-2' may be included in plural, and may be located apart from each other in the Y-axis direction.

The semiconductor package PK2 may include a first chip 16 and a second chip 20-2. The first chip 16 may have a first width W1 in the X-axis direction. The second chip 20-2 may be stacked on the first chip 16 to form a mesa shape. The second chip 20-2 may be attached onto the first chip 16 with a second adhesive layer 18-2 therebetween. The second chip 20-2 may include a first edge portion 20-2e1, a second edge portion 20-2e2, a third edge portion 20-2e3, and a fourth edge portion 20-2e4.

The second chip 20-2 may have a third width W3 in the X-axis direction. The third width W3 may be less than the first width W1. The second chip 20-2 may be shorter than the first chip 16 in the X-axis direction, so that a top surface of the first chip 16 is exposed with respect to the second chip 20-2 at opposite sides of the second chip 20-2 in the X-axis direction. A first step and a second step may be formed at a first side and a second, opposite side of the chip stack that includes the first chip 16 and the second chip 20-2. The portion of the first chip 16 not covered by the second chip 20-2 may have a first exposed length OS-2a and a second exposed length OS-2b in the X-axis direction, on the first chip 16. Thus, the first chip 16 and second chip 20-2 are stacked in a step-wise manner.

According to an mesa stacking manner, an exposure region EP-2a adjacent to the first edge portion 16e1, which is at a first side of the first chip 16, and exposing a portion of the surface of the first chip 16, and an additional exposure region EP-2b adjacent to the second edge portion 16e2, which is a second side of the first chip 16 opposite the first side, and exposing a portion of the surface of the first chip 16 may be provided. The exposure region EP-2a may correspond to the exposure region EP of FIGS. 1A, 1B, and 2.

The semiconductor package PK2 may include a plurality of first bonding pads 24 (e.g., a first set of first bonding pads), a plurality of dummy bonding pads 26 (e.g., a first set of dummy bonding pads, or relay bonding pads), a plurality of additional first bonding pads 24-2 (e.g., a second set of first bonding pads), and a plurality of additional dummy bonding pads 26-2 (e.g., a second set of dummy bonding pads, or relay bonding pads). The first bonding pads 24 and the dummy bonding pads 26 have been described above, and thus, repeated descriptions thereof are omitted here.

The additional first bonding pads 24-2 may be arranged on a portion of the additional exposure region EP-2b that is adjacent to the second edge portion 16e2, which is an opposite side of the first chip 16 as the first edge portion 16e1. The additional first bonding pads 24-2 may be additional chip pads or additional signal pads on the first chip 16. The additional first bonding pads 24-2 may be electrically connected to circuit devices in the first chip 16.

The additional first bonding pads 24-2 may be driving pads for driving the first chip 16. As shown in FIGS. 6A and 6B, the additional first bonding pads 24-2 may be arranged apart from each other in the Y-axis direction on a first row 1C-2 along the second edge portion 16e2.

The additional dummy bonding pads 26-2 may be arranged on a portion of the additional exposure region EP-2b that is further from the second edge portion 16e2 of the first chip 16 than the additional first bonding pads 24-2 are. The additional dummy bonding pads 26-2 may be additional dummy pads on the first chip 16. The additional dummy bonding pads 26-2 may not be electrically connected to the circuit devices in the first chip 16.

As shown in FIGS. 6A and 6B, the additional dummy bonding pads 26-2 may be arranged apart from each other in the Y-axis direction on a second row 2C-2 along the second edge portion 16e2 of the first chip 16. The second row 2C-2 is spaced apart from the first row 1C-2 in the X-axis direction perpendicular to the Y-axis direction.

The additional dummy bonding pads 26-2 may be arranged between the additional first bonding pads 24-2 in the Y-axis direction (e.g., when viewed from the X-axis direction). In FIGS. 6A, 6B, and 7, the additional dummy bonding pads 26-2 may be all arranged between the additional first bonding pads 24-2 in the Y-axis direction. However, in some embodiments, some of the additional dummy bonding pads 26-2 may not be arranged between the additional first bonding pads 24-2 in the Y-axis direction. The additional dummy bonding pads 26-2 are not aligned with the additional first bonding pads 24-2 in the X-axis direction.

The semiconductor package PK2 may include a plurality of second bonding pads 28 and a plurality of additional second bonding pads 28-2. The second bonding pads 28 have been described above, and thus, repeated descriptions thereof are omitted here.

The additional second bonding pads 28-2 may be formed on a surface of the second chip 20. The additional second bonding pads 28-2 may be additional chip pads or additional signal pads on the second chip 20. The additional second bonding pads 28-2 may be electrically connected to circuit devices in the second chip 20. As shown in FIGS. 6A and 6B, the additional second bonding pads 28-2 may be arranged apart from each other in the Y-axis direction along the second edge portion 20-2e2 of the second chip 20.

In FIGS. 6A and 6B, the additional second bonding pads 28-2 are aligned with the additional first bonding pads 24-2 in the X-axis direction. However, in some cases, some of the additional second bonding pads 28-2 may not be aligned with the additional first bonding pads 24-2 in the X-axis direction.

The semiconductor package PK2 may include bonding wires 30, 32, and 34 and additional bonding wires 30-2, 32-2, and 34-2. The bonding wires 30, 32, and 34 have been described above, and thus, repeated descriptions thereof are omitted here.

The additional bonding wires 30-2, 32-2, and 34-2 may electrically connect the first chip 16, the second chip 20-2, and the package substrate 10 to one another. As shown in FIGS. 6B and 7, the additional bonding wires 30-2, 32-2, and 34-2 may include additional first bonding wires 30-2 for connecting the additional first bonding pads 24-2 of the first chip 16 to the additional substrate pads 22-2', additional second bonding wires 32-2 for connecting the additional dummy bonding pads 26-2 of the first chip 16 to the additional substrate pads 22-2, and additional third bonding wires 34-2 for connecting the additional second bonding pads 28-2 of the second chip 20-2 to the additional dummy bonding pads 26-2 of the first chip 16.

In FIGS. 6A and 6B, the additional second bonding pads 28-2 of the second chip 20-2 and the additional dummy bonding pads 26-2 of the first chip 16 are all connected to each other by the additional third bonding wires 34-2. However, in some cases, some of the additional second bonding pads 28-2 of the second chip 20-2 may not be connected to the additional dummy bonding pads 26-2 of the first chip 16. For convenience of explanation, FIG. 7 illustrates that the additional substrate pad 22-2 and the additional substrate pad 22-2' are spaced apart from each other in the X-axis direction.

The semiconductor package PK2 may include a molding layer 36 for sealing the first chip 16, the second chip 20-2, the first bonding pads 24, the additional first bonding pads 24-2, the dummy bonding pads 26, the additional dummy bonding pads 26-2, the second bonding pads 28, the additional second bonding pads 28-2, the bonding wires 30, 32, and 34, and the additional bonding wires 30-2, 32-2, and 34-2.

The semiconductor package PK2 may include the additional bonding wires 34-2 and 32-2 electrically connecting the additional second bonding pads 28-2 to the additional substrate pads 22-2 through the additional dummy bonding pads 26-2. In the semiconductor package PK2, each of the additional bonding wires 32-2 and 34-1 electrically connecting the additional second bonding pads 34-2 to the additional substrate pads 22-2 through the additional dummy bonding pads 26-2 may be relatively short. Accordingly, the semiconductor package PK2 may have a reduced total thickness.

Figure 8A:
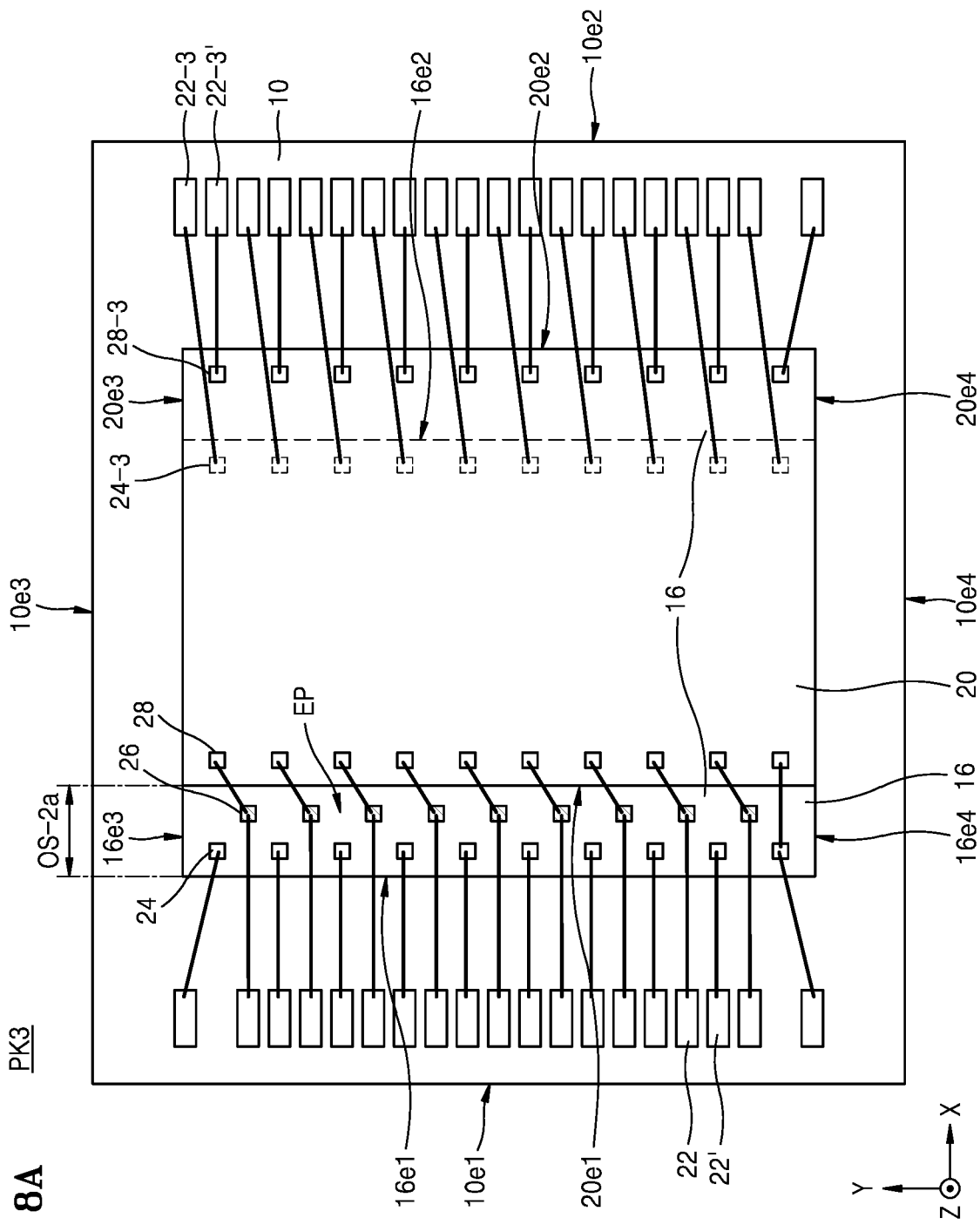
FIGS. 8A and 8B are plan views of a semiconductor package according to an embodiment of the inventive concept.
Figure 8B:
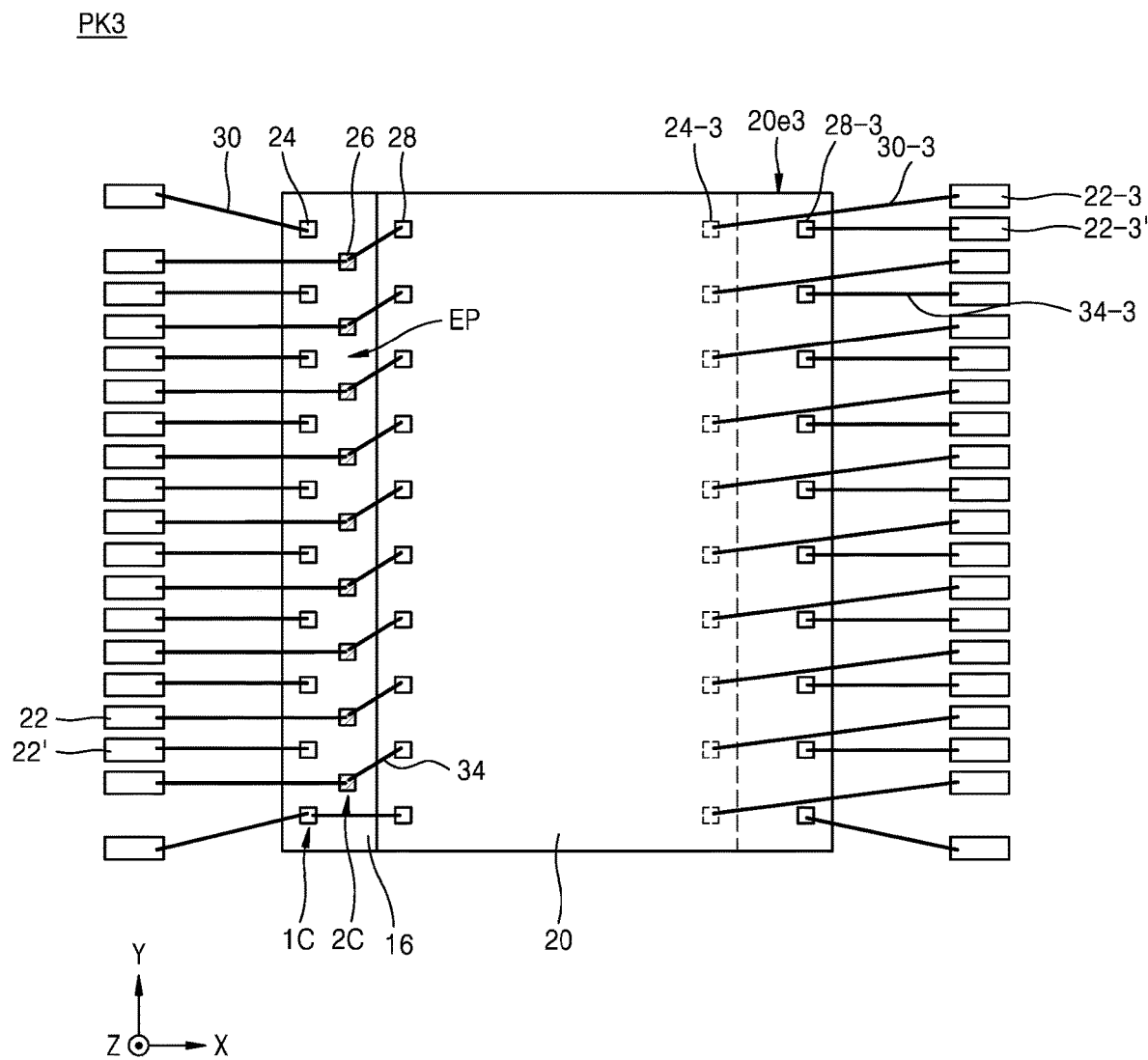
Figure 9:
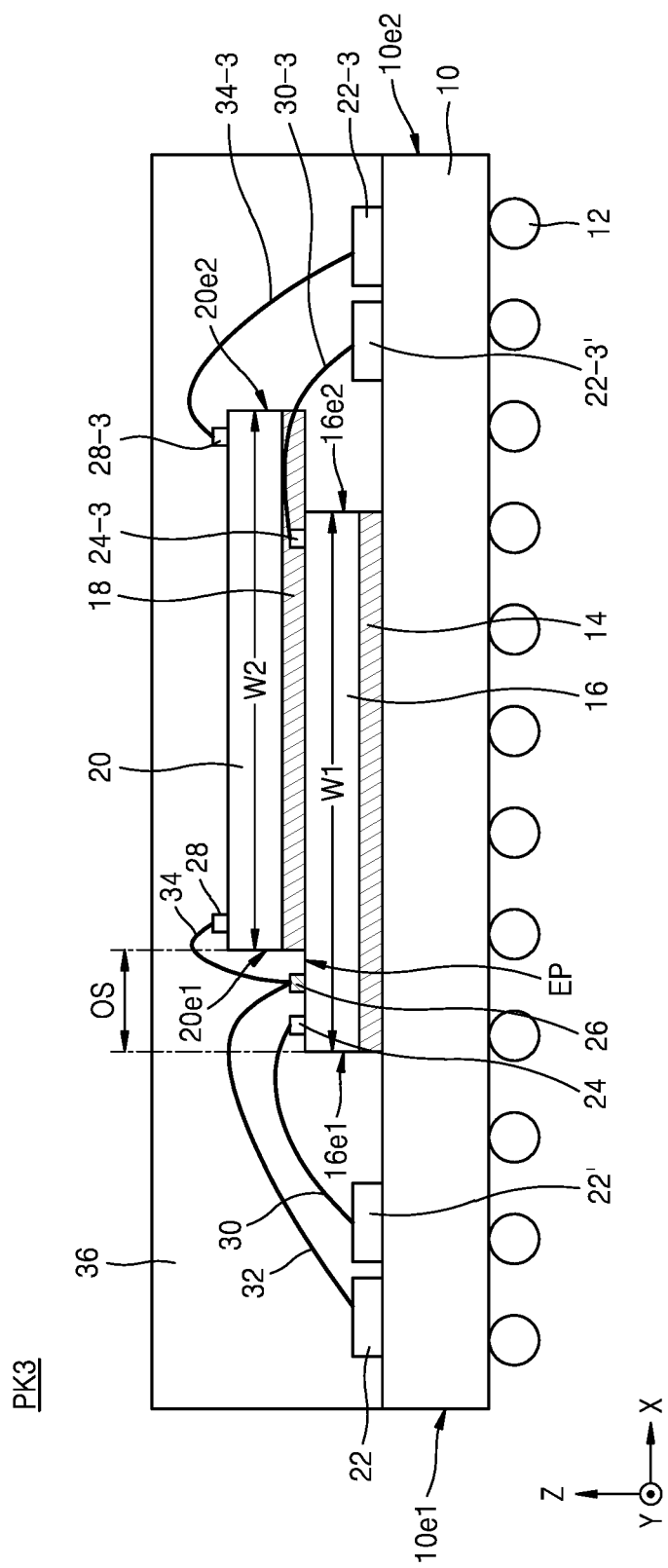
FIG. 9 is a cross-sectional view of the semiconductor package of FIGS. 8A and 8B according to an embodiment of the inventive concept.

FIGS. 8A and 8B are plan views for explaining a semiconductor package PK3 according to an embodiment of the inventive concept, and FIG. 9 is a cross-sectional view of the semiconductor package PK3 of FIGS. 8A and 8B.

In detail, the semiconductor package PK3 may be the same as the semiconductor package PK1 of FIGS. 1A, 1B, and 2 except that additional first bonding pads 24-3, additional second bonding pads 28-3, and additional bonding wires 30-3 and 34-3 are further included.

In FIGS. 8A, 8B, and 9, reference numerals similar to or the same as FIGS. 1A, 1B, and 2 indicate the same or similar members. Descriptions of FIGS. 8A, 8B, and 9 identical to those given above with reference to FIGS. 1A, 1B, and 2 are omitted or briefly given below.

The semiconductor package PK3 may include the package substrate 10, substrate pads 22 and 22' provided on one side portion of the package substrate 10, and additional substrate pads 22-3 and 22-3' provided on the other side portion of the package substrate 10. The additional substrate pads 22-3 and 22-3' may be located adjacent to a second edge portion 10e2, which is the other side of the package substrate 10. The additional substrate pads 22-3 and 22-3' may be referred to as additional substrate bonding pads. The additional substrate pads 22-3 and 22-3' may be included in plural, and may be arranged and located apart from each other in the Y-axis direction.

The semiconductor package PK3 may include a first chip 16 and a second chip 20. The first chip 16 may be mounted on the package substrate 10. The second chip 20 may be stacked on the first chip 16 in an offset manner. The first chip 16 and the second chip 20 have been described above, and thus, repeated descriptions thereof are omitted here.

The semiconductor package PK3 may include a plurality of first bonding pads 24, a plurality of dummy bonding pads 26, a plurality of additional first bonding pads 24-3, and a plurality of additional second bonding pads 28-3. The first bonding pads 24 and the dummy bonding pads 26 have been described above, and thus, repeated descriptions thereof are omitted here.

The additional first bonding pads 24-3 may be arranged on a surface of the first chip 16 at a position that is adjacent to the second edge portion 16e2, which is the other side of the first chip 16. The additional first bonding pads 24-3 may be additional chip pads or additional signal pads on the first chip 16. The additional first bonding pads 24-3 may be electrically connected to circuit devices in the first chip 16.

The additional first bonding pads 24-3 may be driving pads for driving the first chip 16. As shown in FIGS. 8A and 8B, the additional first bonding pads 24-3 may be arranged in and may be apart from each other in the Y-axis direction along the second edge portion 16e2, which is the other side of the first chip 16.

The additional second bonding pads 28-3 may be arranged on a surface of the second chip 20 at a location that is adjacent to the second edge portion 20e2, which is the other side of the second chip 20. The additional second bonding pads 28-3 may be additional chip pads or additional signal pads on the second chip 20. The additional second bonding pads 28-3 may be electrically connected to circuit devices in the second chip 20.

As shown in FIGS. 8A and 8B, the additional second bonding pads 28-3 may be arranged and may be apart from each other in the Y-axis direction along the second edge portion 20e2, which is the other side of the second chip 20.

The semiconductor package PK3 may include bonding wires 30, 32, and 34 and additional bonding wires 30-3 and 34-3. The bonding wires 30, 32, and 34 have been described above, and thus, repeated descriptions thereof are omitted here. The additional bonding wires 30-3 and 34-3 may electrically connect the first chip 16, the second chip 20, and the package substrate 10 to one another.

As shown in FIGS. 8B and 9, the additional bonding wires 30-3 and 34-3 may include additional second bonding wires 30-3 for connecting the additional first bonding pads 24-3 of the first chip 16 to the additional substrate pads 22-3', and additional second bonding wires 34-3 for connecting the additional second bonding pads 28-3 of the second chip 20 to the additional substrate pads 22-3. For convenience of explanation, FIG. 9 illustrates that the additional substrate pad 22-3 and the additional substrate pad 22-3' are spaced apart from each other in the X-axis direction, though as shown in the embodiment of FIGS. 8A and 8B, the additional substrate pads 22-3 and the additional substrate pads 22-3' are aligned in the Y-axis direction and are not spaced apart from each other in the X-axis direction. The additional second bonding wires 30-3 may be covered at least in part by the adhesive layer 18.

The semiconductor package PK3 may include a molding layer 36 for sealing the first chip 16, the second chip 20, the first bonding pads 24, the additional first bonding pads 24-3, the dummy bonding pads 26, the second bonding pads 28, the additional second bonding pads 28-3, the bonding wires 30, 32, and 34, and the additional bonding wires 30-3 and 34-3.

Because the semiconductor package PK3 includes the additional first bonding pads 24-3, the additional second bonding pads 28-3, and the additional bonding wires 30-3 and 34-3 as described above, the semiconductor package PK3 may easily electrically connect the first chip 16 and the second chip 20 to the package substrate 10. In this case, each second bonding pad 28-3 may be connected to a respective additional substrate pad 22-3 by a direct wire bonding connection, and each additional first bonding pad 24-3 may be connected to a respective additional substrate pad 22-3' by a direct wire bonding connection. A "direct wire bonding" connection as used herein refers to a connection between two wire bonding terminals (e.g., two pads) using a single wire. In FIGS. 8A, 8B, and 9, as well as other examples, various pads of the package substrate (e.g., a substrate pad 22) are connected to pads of an upper chip of a chip stack (e.g., a second bonding pad 28 of chip 20) by indirect wire bonding or relay wire bonding. As used herein, an "indirect wire bonding" or "relay wire bonding" refers to a connection between two wire bonding terminals (e.g., two pads) using a plurality of wires in series.

Figure 10A:
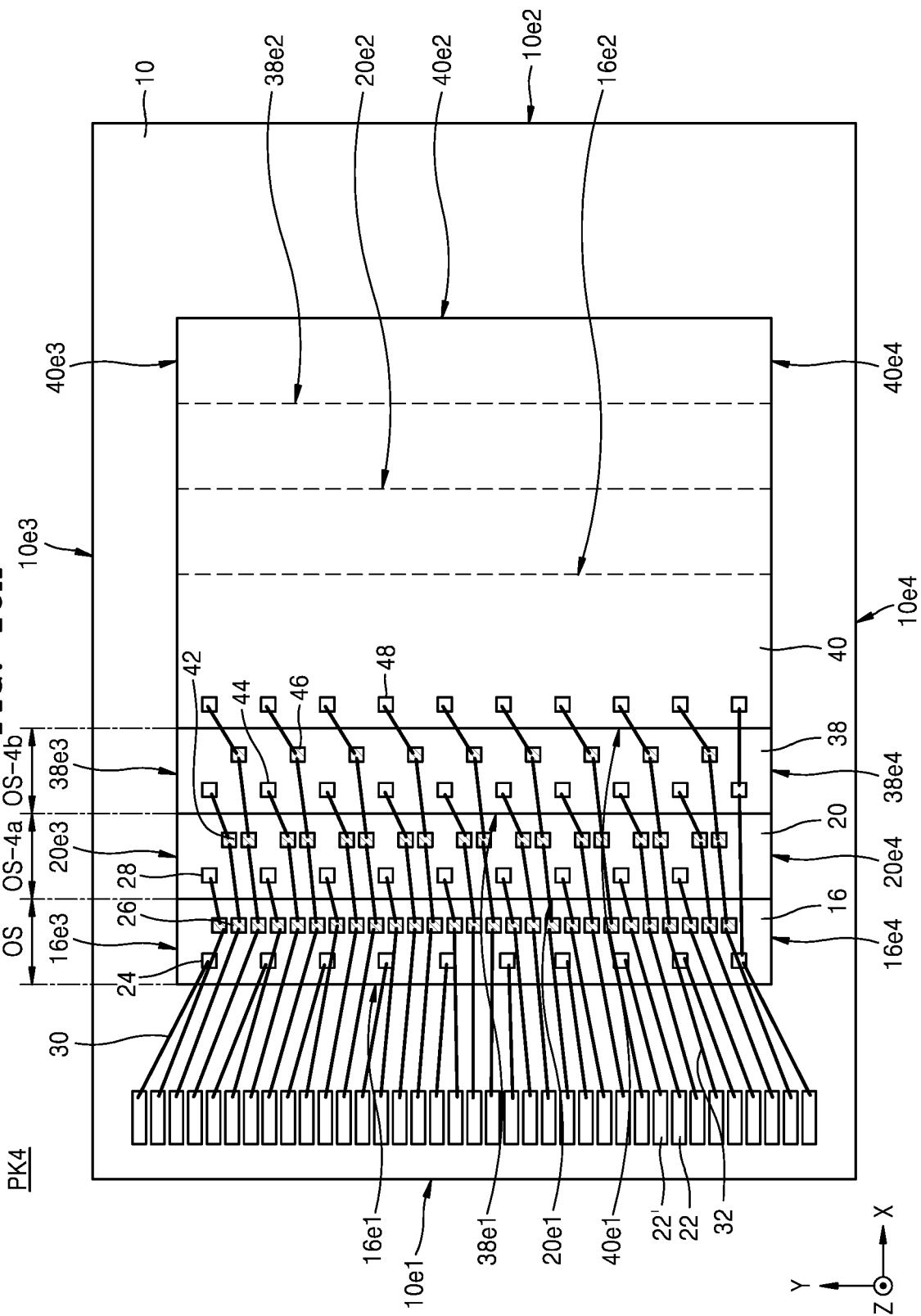
FIGS. 10A and 10B are plan views of a semiconductor package according to an embodiment of the inventive concept.
Figure 10B:
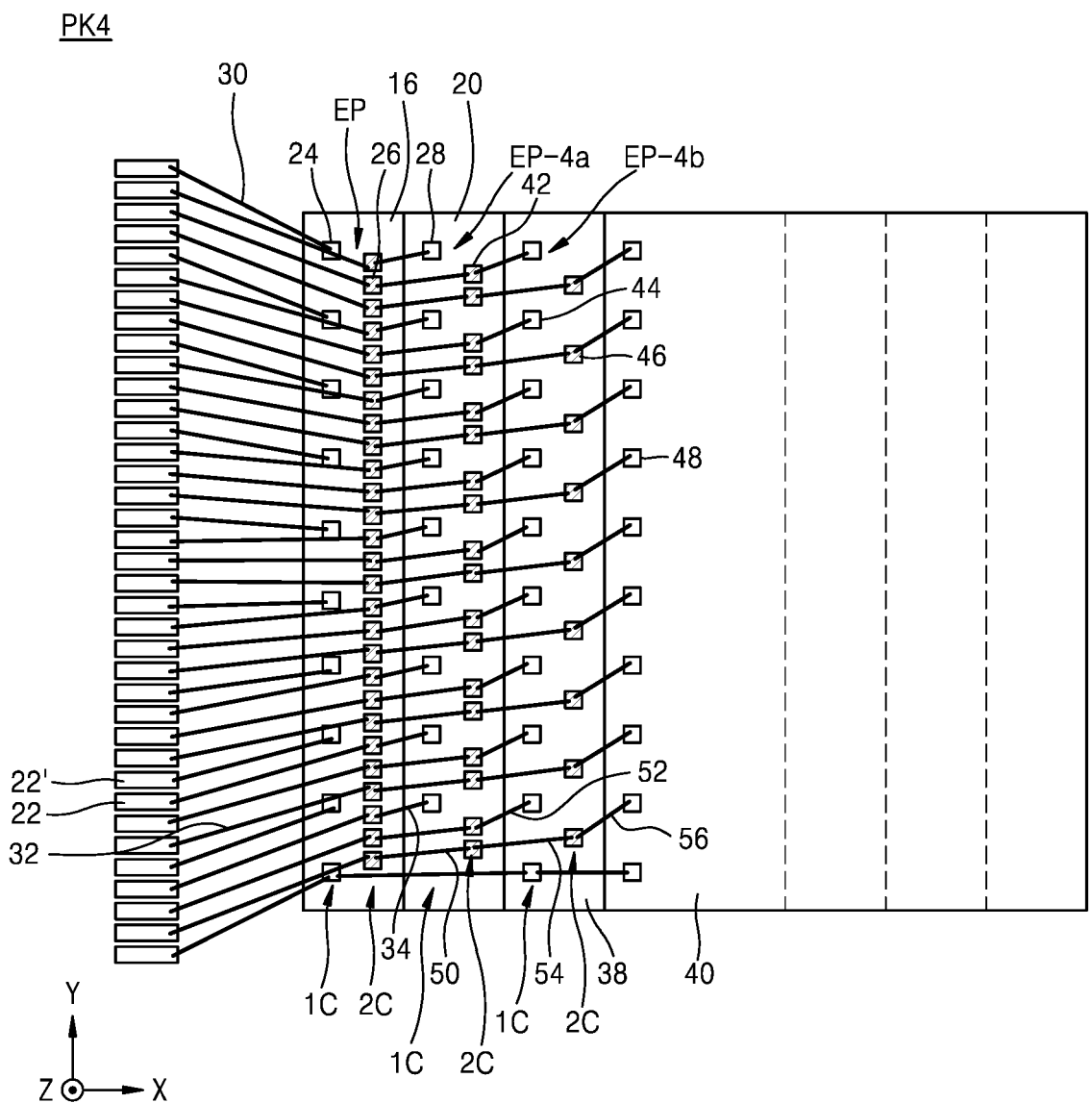
Figure 11:
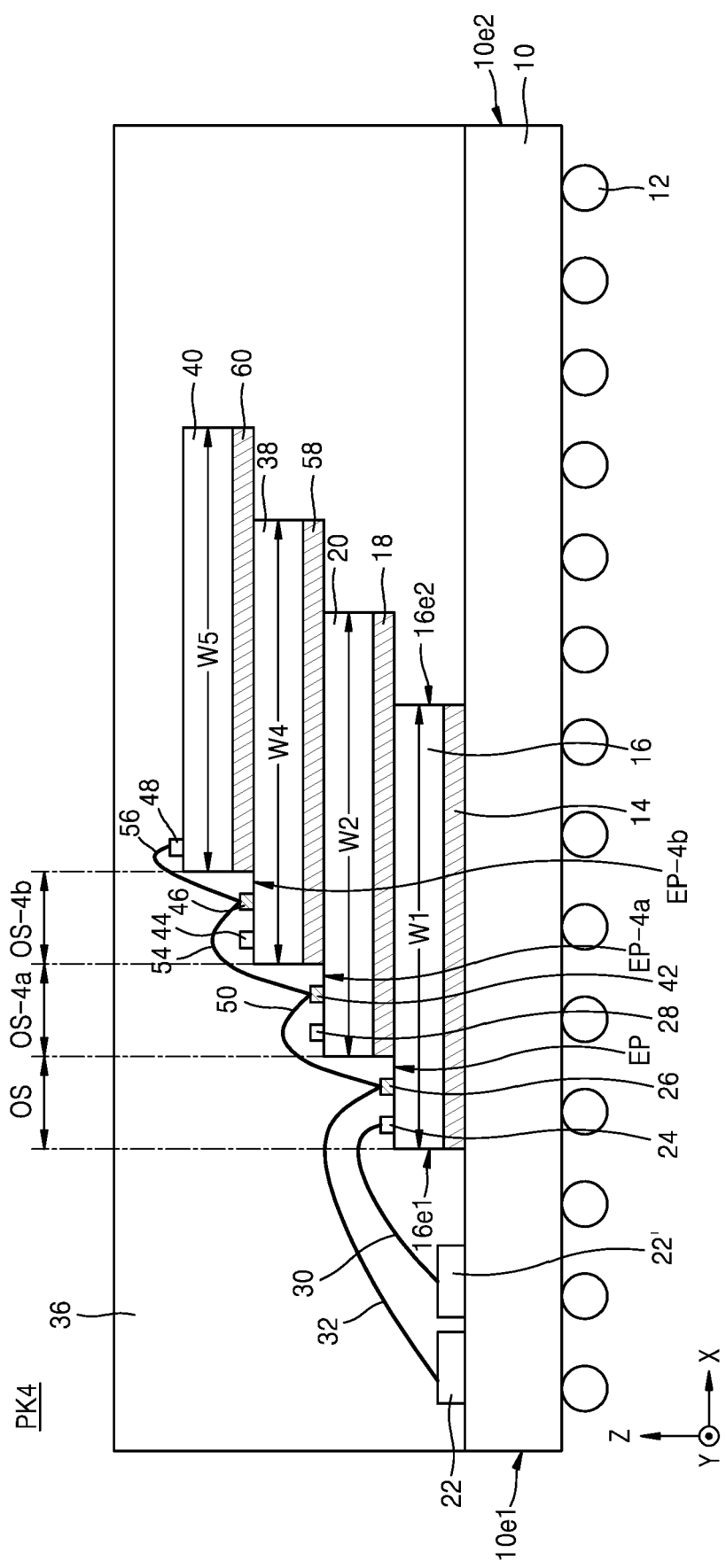
FIG. 11 is a cross-sectional view of the semiconductor package of FIGS. 10A and 10B.

FIGS. 10A and 10B are plan views for explaining a semiconductor package PK4 according to an embodiment of the inventive concept, and FIG. 11 is a cross-sectional view of the semiconductor package PK4 of FIGS. 10A and 10B.

In detail, the semiconductor package PK4 may be the same as the semiconductor package PK1 of FIGS. 1A, 1B, and 2 except that a third chip 38, a fourth chip 40, a second exposure region EP-4a, and a third exposure region EP-4b are further included and a plurality of second dummy bonding pads 42 and a plurality of third dummy bonding pads 46 are further included in the second exposure region EP-4a and the third exposure region EP-4b, respectively.

In FIGS. 10A, 10B, and 11, reference numerals similar to or the same as FIGS. 1A, 1B, and 2 indicate the same or similar members. Descriptions of FIGS. 10A, 10B, and 11 identical to those given above with reference to FIGS. 1A, 1B, and 2 are omitted or briefly given below.

The semiconductor package PK4 may include a package substrate 10, and substrate pads 22 and 22' provided on one side portion of the package substrate 10. The semiconductor package PK4 may include a second chip 20, a third chip 38, and a fourth chip 40 stacked on a first chip 16. The first chip 16 may be mounted on the package substrate 10. As described above, the first chip 16 may be a base chip mounted on the package substrate 10. The second chip 20, the third chip 38, and the fourth chip 40 may be stacked chips stacked on the first chip 16.

In more detail, the second chip 20 may be stacked on the first chip 16 in an offset manner. The second chip 20 may be offset on the first chip 16 by an offset length OS in the X-axis direction. According to the present embodiment, the offset length OS may be referred to as a first offset length.

An exposure region EP exposing a portion of the surface of the first chip 16 may be provided according to an offset stacking manner. According to the present embodiment, the exposure region EP is referred to as a first exposure region. First bonding pads 24 and a plurality of first dummy bonding pads 26 may be arranged on the first exposure region EP. According to the present embodiment, the dummy bonding pads 26 are referred to as first dummy bonding pads, or first relay bonding pads.

Three first dummy bonding pads 26 may be arranged between the first bonding pads 24 in the Y-axis direction (e.g., when viewed from the X-axis direction). Because the semiconductor package PK4 has a stack of four chips, three first dummy bonding pads 26 may be arranged on the first chip 16 between the first bonding pads 24 in the Y-axis direction. The first chip 16, the first exposure region EP, the first bonding pads 24, and the first dummy bonding pads 26 have been described above, and thus, repeated descriptions thereof are omitted here.

The third chip 38 may be stacked on the second chip 20 in an offset manner. The third chip 38 may be stacked on the second chip 20 in a cascade type, namely, in a staircase type. The third chip 38 may be attached onto the second chip 20 with a third adhesive layer 58 therebetween. The third chip 38 may include a first edge portion 38e1, a second edge portion 38e2, a third edge portion 38e3, and a fourth edge portion 38e4. The third chip 38 may be the same kind or a different kind of chip as or from the first chip 16.

The third chip 38 may be offset on the second chip 20 by a second offset length OS-4a in the X-axis direction. The second offset length OS-4a may be equal to the first offset length OS. A second exposure region EP-4a exposing a portion of the surface of the second chip 20 may be provided according to an offset stacking manner. The third chip 38 may have a fourth width W4 in the X-axis direction. The fourth width W4 may be equal to the first width W1, for example.

The semiconductor package PK4 may include a plurality of second bonding pads 28 and a plurality of second dummy bonding pads 42. The second bonding pads 28 may be arranged on a portion of the second exposure region EP-4a that is closer to the first edge portion 20e1, which is one side of the second chip 20. The second bonding pads 28 may be chip pads or signal pads on the second chip 20. The second bonding pads 28 may be electrically connected to circuit devices in the second chip 20.

The second bonding pads 28 may be driving pads for driving the second chip 20. As shown in FIGS. 10A and 10B, the second bonding pads 28 may be arranged apart from each other in the Y-axis direction on a first row 1C along the first edge portion 20e1, which is one side of the second chip 20.

The second dummy bonding pads 42 may be arranged on a portion of the second exposure region EP-4a that is further from the first edge portion 20e1 than the second bonding pads 28, which is one side of the second chip 20. The second dummy bonding pads 42 may be second dummy pads on the second chip 20. The second dummy bonding pads 42 may not be electrically connected to the circuit devices in the second chip 20.

As shown in FIGS. 10A and 10B, the second dummy bonding pads 42 may be arranged apart from each other in the Y-axis direction on a second row 2C along the first edge portion 20e1, which is one side of the second chip 20. The second row 2C is spaced apart from the first row 1C in the X-axis direction perpendicular to the Y-axis direction.

The second dummy bonding pads 42 may be arranged between the second bonding pads 24 in the Y-axis direction (e.g., when viewed from the X-axis direction). Two second dummy bonding pads 42 may be arranged between two adjacent pads of the second bonding pads 28 in the Y-axis direction. Because the semiconductor package PK4 has a stack of four chips, two second dummy bonding pads 42 may be arranged on the second chip 20 between each set of two adjacent pads of the second bonding pads 28 in the Y-axis direction (e.g., when viewed from the X-axis direction).

In FIGS. 10A, 10B, and 11, the second dummy bonding pads 42 may be all arranged between the second bonding pads 28 in the Y-axis direction. However, in some embodiments, some of the second dummy bonding pads 42 may not be arranged between the second bonding pads 28 in the Y-axis direction. The second dummy bonding pads 42 are not aligned with the second bonding pads 28 in the X-axis direction or the Y-axis direction.

The fourth chip 40 may be stacked on the third chip 38 in an offset manner. The fourth chip 40 may be stacked on the third chip 38 in a cascade type, namely, in a staircase type. The fourth chip 40 may be attached onto the third chip 38 with a fourth adhesive layer 60 therebetween. The fourth chip 40 may include a first edge portion 40e1, a second edge portion 40e2, a third edge portion 40e3, and a fourth edge portion 40e4. The fourth chip 40 may be the same kind or a different kind of chip as or from the first chip 16.

The fourth chip 40 may be offset on the third chip 38 by a third offset length OS-4b in the X-axis direction. The third offset length OS-4b may be equal to the first offset length OS. A third exposure region EP-4b exposing a portion of the surface of the third chip 38 may be provided according to an offset stacking manner. The fourth chip 40 may have a fifth width W5 in the X-axis direction. The fifth width W5 may be equal to the first width W1, for example.

The semiconductor package PK4 may include a plurality of third bonding pads 44 and a plurality of third dummy bonding pads 46. The third bonding pads 44 may be arranged on a portion of the third exposure region EP-4b that is adjacent to the first edge portion 38e1, which is one side of the third chip 38. The third bonding pads 44 may be chip pads or signal pads on the third chip 38. The third bonding pads 44 may be electrically connected to circuit devices in the third chip 38.

The third bonding pads 44 may be driving pads for driving the third chip 38. As shown in FIGS. 10A and 10B, the third bonding pads 44 may be arranged apart from each other in the Y-axis direction on the third chip 38 in a first row 1C along the first edge portion 38e1, which is one side of the third chip 38.

The third dummy bonding pads 46 may be arranged on a portion of the third exposure region EP-4b that is further from the first edge portion 38e1 than the third bonding pads 44, which is one side of the third chip 38. The third dummy bonding pads 46 may be third dummy pads on the third chip 38. The third dummy bonding pads 46 may not be electrically connected to the circuit devices in the third chip 38.

As shown in FIGS. 10A and 10B, the third dummy bonding pads 46 may be arranged apart from each other in the Y-axis direction on a second row 2R along the first edge portion 38e1, which is one side of the third chip 38. The second row 2C is spaced apart from the first row 1C in the X-axis direction perpendicular to the Y-axis direction.

The third dummy bonding pads 46 may be arranged between the third bonding pads 44 in the Y-axis direction. One third dummy bonding pad 46 may be arranged between the third bonding pads 44 in the Y-axis direction. Because the semiconductor package PK4 has a stack of four chips, one third dummy bonding pad 44 may be arranged on the third chip 38 between the second bonding pads 44 in the Y-axis direction.

In FIGS. 10A, 10B, and 11, the third dummy bonding pads 46 may be all arranged between the third bonding pads 44 in the Y-axis direction. However, in some embodiments, some of the third dummy bonding pads 46 may not be arranged between the third bonding pads 44 in the Y-axis direction. The third dummy bonding pads 46 are not aligned with the third bonding pads 44 in the X-axis direction or the Y-axis direction.

The semiconductor package PK4 may include a plurality of fourth bonding pads 48. The fourth bonding pads 48 may be formed on a surface of the fourth chip 40. The fourth bonding pads 48 may be chip pads or signal pads on the fourth chip 40.

The fourth bonding pads 48 may be electrically connected to circuit devices in the fourth chip 40. As shown in FIGS. 10A and 10B, the fourth bonding pads 48 may be arranged apart from each other in the Y-axis direction along the first edge portion 40e1, which is one side of the fourth chip 40.

In FIGS. 10A and 10B, the third and fourth bonding pads 44 and 48 are aligned with the first and second bonding pads 24 and 28 in the X-axis direction. However, in some cases, the third and fourth bonding pads 44 and 48 may not be aligned with the first and second bonding pads 24 and 28 in the X-axis direction.

The semiconductor package PK4 may include bonding wires 30, 32, 34, 50, 52, 54, and 56. The bonding wires 30, 32, 34, 50, 52, 54, and 56 may electrically connect the first chip 16, the second chip 20, the third chip 38, and the fourth chip 40 to the package substrate 10.

As shown in FIGS. 10B and 11, the bonding wires 30, 32, 34, and 50 may include first bonding wires 30 for connecting the first bonding pads 24 of the first chip 16 to the substrate pads 22', second bonding wires 32 for connecting the first dummy bonding pads 26 of the first chip 16 to the substrate pads 22, third bonding wires 34 for connecting the second bonding pads 28 of the second chip 20 to the first dummy bonding pads 26 of the first chip 16, and fourth bonding wires 50 for connecting the second dummy bonding pads 42 of the second chip 20 to the first dummy bonding pads 26 of the first chip 16.

As shown in FIGS. 10B and 11, the bonding wires 52, 54, and 56 may include fifth bonding wires 52 for connecting the third bonding pads 44 of the third chip 38 to the second dummy bonding pads 42 of the first chip 20, sixth bonding wires 54 for connecting the third dummy bonding pads 46 of the third chip 38 to the second dummy bonding pads 42 of the second chip 20, and seventh bonding wires 56 for connecting the fourth bonding pads 48 of the fourth chip 40 to the third dummy bonding pads 46 of the third chip 38. For convenience of explanation, FIG. 11 illustrates that the substrate pad 22 and the substrate pad 22' are spaced apart from each other in the X-axis direction.

The semiconductor package PK4 may include the bonding wires 32, 50, 54, and 56 electrically connecting the fourth bonding pads 48 to the substrate pads 22 through the first dummy bonding pads 26, the second dummy bonding pads 42, and the third dummy bonding pads 46. The semiconductor package PK4 may reduce a bonding wire length between the fourth bonding pads 48 and the substrate pad 22 by including the first dummy bonding pads 26, the second dummy bonding pads 42, and the third dummy bonding pads 46. In this manner, connections between upper chips and the package substrate may be made using cascading wires connected by relay pads. Accordingly, the semiconductor package PK4 may have a reduced total thickness.

The semiconductor package PK4 may include a molding layer 36 that seals the first through fourth chips 16, 20, 38, and 40, the first through fourth bonding pads 24, 34, 44, and 48, the first through third dummy bonding pads 26, 42, and 46, and the bonding wires 30, 32, 34, 50, 52, 54, and 56. The molding layer 36 may be epoxy resin.

Figure 12A:
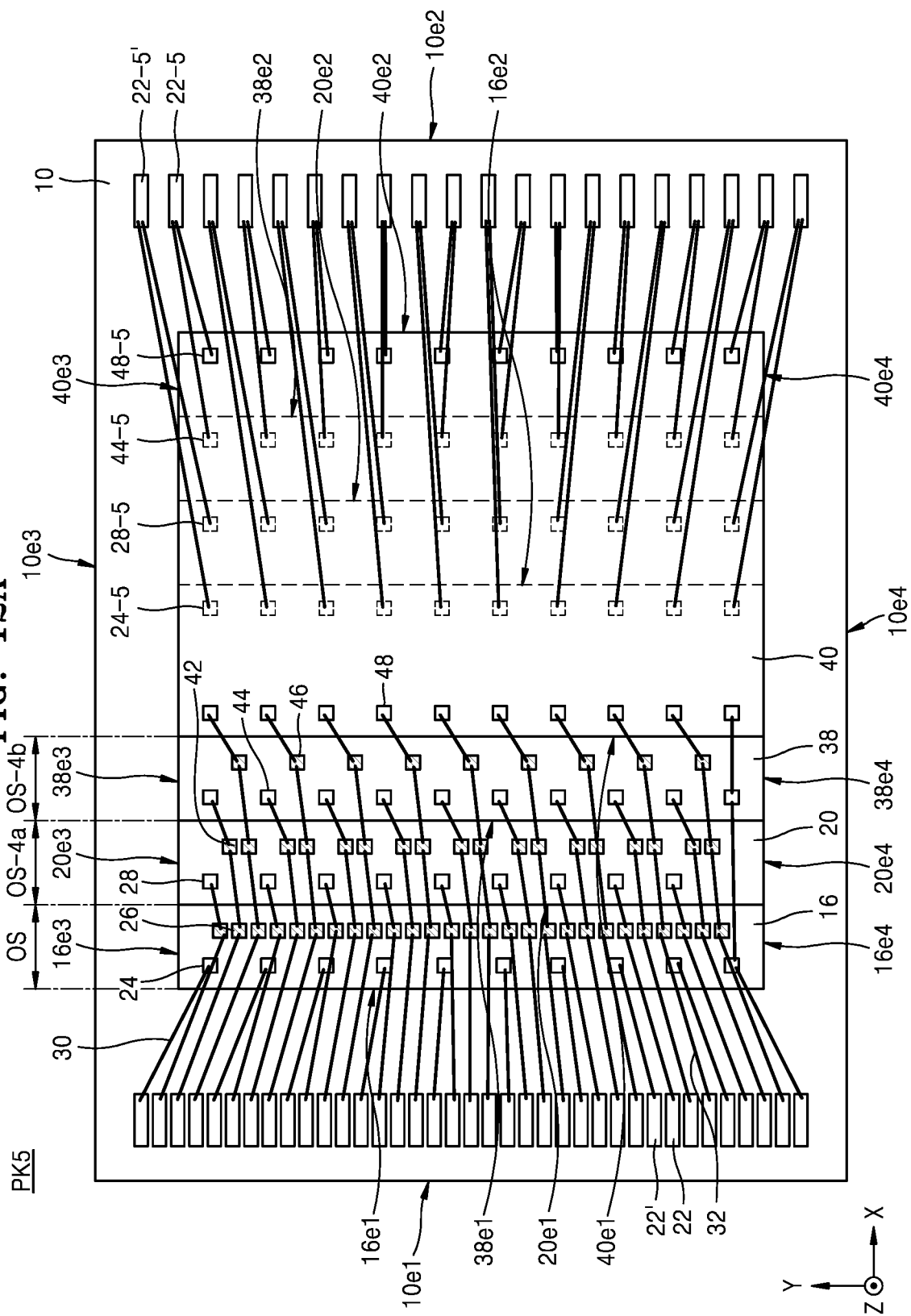
FIGS. 12A and 12B are plan views of a semiconductor package according to an embodiment of the inventive concept.
Figure 12B:
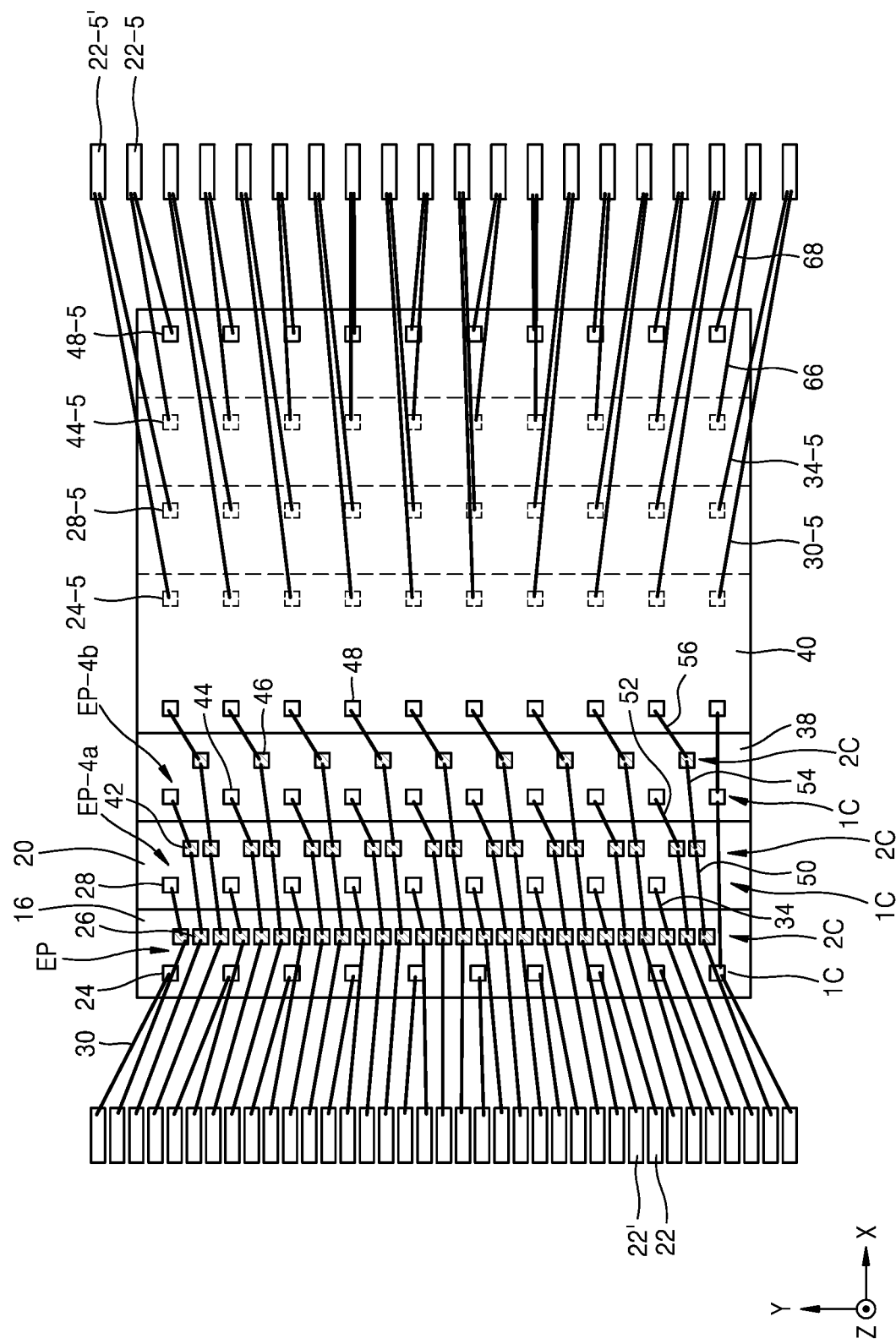
Figure 13:
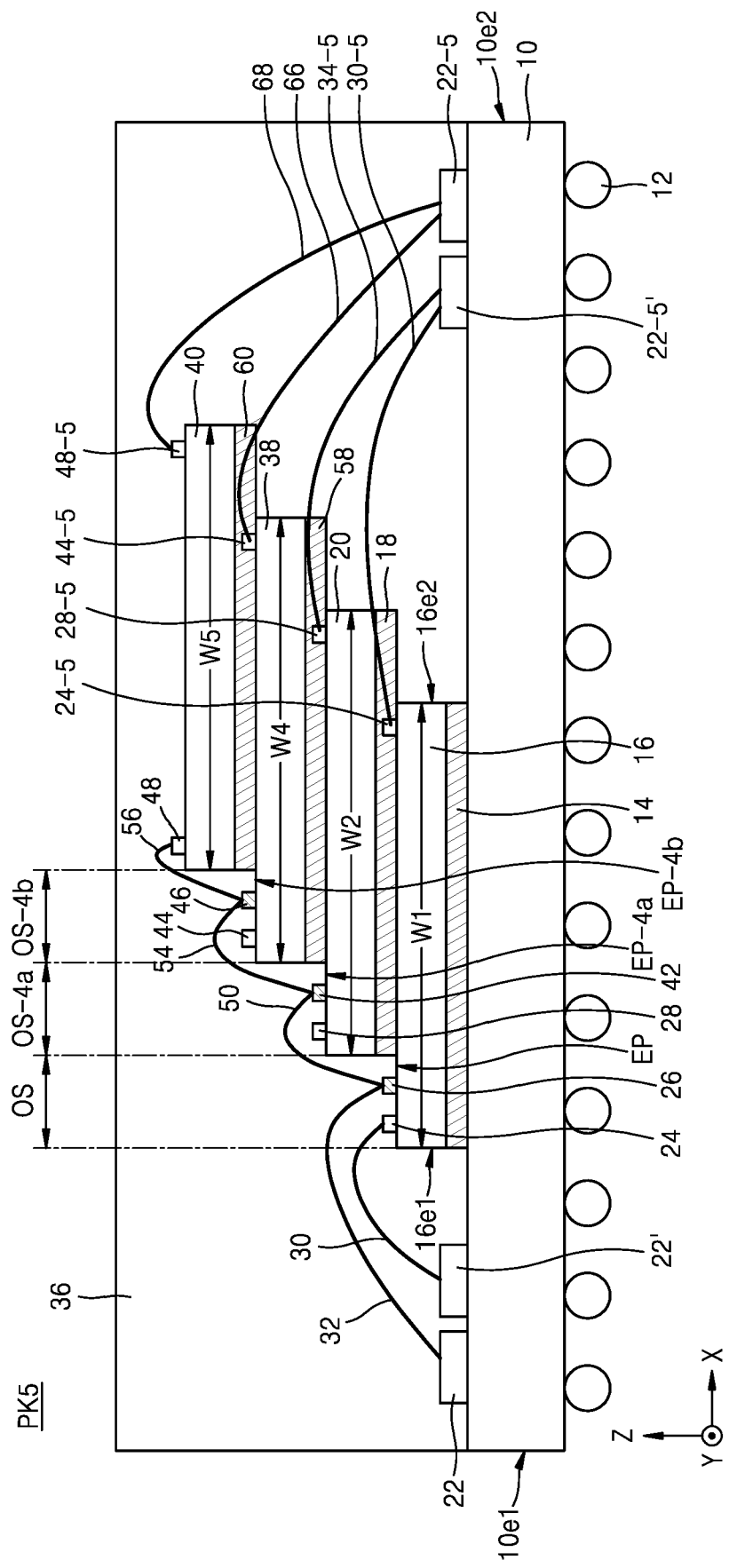
FIG. 13 is a cross-sectional view of the semiconductor package of FIGS. 12A and 12B according to an embodiment of the inventive concept.

FIGS. 12A and 12B are plan views for explaining a semiconductor package PK5 according to an embodiment of the inventive concept, and FIG. 13 is a cross-sectional view of the semiconductor package PK5 of FIGS. 12A and 12B.

In detail, the semiconductor package PK5 may be the same as the semiconductor package PK4 of FIGS. 10A, 10B, and 11 except that additional first bonding pads 24-5, additional second bonding pads 28-5, additional third bonding pads 44-5, additional fourth bonding pads 48-5, and additional bonding wires 30-5, 34-5, 66, and 68 are further included.

In FIGS. 12A, 12B, and 13, reference numerals similar to or the same as FIGS. 10A, 10B, and 11 indicate the same or similar members. Descriptions of FIGS. 12A, 12B, and 13 identical to those given above with reference to FIGS. 10A, 10B, and 11 are omitted or briefly given below.

The semiconductor package PK5 may include the package substrate 10, substrate pads 22 and 22' provided on one side portion of the package substrate 10, and additional substrate pads 22-5 and 22-5' provided on the other side portion of the package substrate 10. The additional substrate pads 22-5 and 22-5' may be located adjacent to a second edge portion 10e2, which is the other side of the package substrate 10. The additional substrate pads 22-5 and 22-5' may be referred to as additional substrate bonding pads. The additional substrate pads 22-5 and 22-5' may be included in plural, and may be located apart from each other in the Y-axis direction.

The semiconductor package PK5 may include a first chip 16, a second chip 20, a third chip 38, and a fourth chip 40. The first chip 16 may be mounted on the package substrate 10. The second chip 20, the third chip 38, and the fourth chip 40 may be stacked on the first chip 16 in an offset manner. The first chip 16, the second chip 20, the third chip 38, and the fourth chip 40 have been described above, and thus, repeated descriptions thereof are omitted here.

The semiconductor package PK5 may include a plurality of first bonding pads 24, a plurality of first dummy bonding pads 26, a plurality of additional first bonding pads 24-5, a plurality of second bonding pads 28, a plurality of second dummy bonding pads 42, and a plurality of additional second bonding pads 28-5.

The semiconductor package PK5 may further include a plurality of third bonding pads 44, a plurality of third dummy bonding pads 46, a plurality of additional third bonding pads 44-5, a plurality of fourth bonding pads 48, and a plurality of additional fourth bonding pads 48-5. The first bonding pads 24, the first dummy bonding pads 26, the second bonding pads 28, the second dummy bonding pads 42, the third bonding pads 44, the third dummy bonding pads 46, and the fourth bonding pads 48 have been described above, and thus, repeated descriptions thereof are omitted here.

The additional first bonding pads 24-5 may be arranged on a surface of the first chip 16 that is adjacent to the second edge portion 16e2, which is the other side of the first chip 16. The additional first bonding pads 24-5 may be additional chip pads or additional signal pads on the first chip 16. The additional first bonding pads 24-5 may be electrically connected to circuit devices in the first chip 16.

The additional first bonding pads 24-5 may be driving pads for driving the first chip 16. As shown in FIGS. 12A and 12B, the additional first bonding pads 24-5 may be arranged apart from each other in the Y-axis direction along the second edge portion 16e2, which is the other side of the first chip 16.

The additional second bonding pads 28-5 may be arranged on a surface of the second chip 20 that is adjacent to the second edge portion 20e2, which is the other side of the second chip 20. The additional second bonding pads 28-5 may be additional chip pads or additional signal pads on the second chip 20. The additional second bonding pads 28-5 may be electrically connected to circuit devices in the second chip 20. As shown in FIGS. 12A and 12B, the additional second bonding pads 28-5 may be arranged apart from each other in the Y-axis direction along the second edge portion 20e2, which is the other side of the second chip 20.

The additional third bonding pads 44-5 may be arranged on a surface of the third chip 38 that is adjacent to the second edge portion 38e2, which is the other side of the third chip 38. The additional third bonding pads 44-5 may be additional chip pads or additional signal pads on the third chip 38. The additional third bonding pads 44-5 may be electrically connected to circuit devices in the third chip 38.

As shown in FIGS. 12A and 12B, the additional third bonding pads 44-5 may be arranged apart from each other in the Y-axis direction along the second edge portion 38e2, which is the other side of the third chip 38.

The additional fourth bonding pads 48-5 may be arranged on a surface of the fourth chip 40 that is adjacent to the second edge portion 40e2, which is the other side of the fourth chip 40. The additional fourth bonding pads 48-5 may be additional chip pads or additional signal pads on the fourth chip 40. The additional fourth bonding pads 48-5 may be electrically connected to circuit devices in the fourth chip 40.

As shown in FIGS. 12A and 12B, the additional fourth bonding pads 48-5 may be arranged apart from each other in the Y-axis direction along the second edge portion 40e2, which is the other side of the fourth chip 40.

The semiconductor package PK5 may include bonding wires 30, 32, 34, 50, 52, 54, and 56 and additional bonding wires 30-5, 34-5, 66, and 68. The bonding wires 30, 32, 34, 50, 52, 54, and 56 have been described above, and thus, repeated descriptions thereof are omitted here.

The bonding wires 30-5, 34-5, 66, and 68 may electrically connect the first chip 16, the second chip 20, the third chip 38, and the fourth chip 40 to the package substrate 10. As shown in FIGS. 12B and 13, the additional bonding wires 30-5, 34-5, 66, and 68 may include additional first bonding wires 30-5 for connecting the additional first bonding pads 24-5 of the first chip 16 to the additional substrate pads 22-5', additional second bonding wires 34-5 for connecting the additional second bonding pads 28-5 of the second chip 20 to the additional substrate pads 22-5', additional third bonding wires 66 for connecting the additional third bonding pads 44-5 of the third chip 38 to the additional substrate pads 22-5, and additional fourth bonding wires 68 for connecting the additional fourth bonding pads 48-5 of the fourth chip 40 to the additional substrate pads 22-5. For convenience of explanation, FIG. 13 illustrates that the additional substrate pad 22-5 and the additional substrate pad 22-5' are spaced apart from each other in the X-axis direction, though as shown in the embodiment of FIGS. 12A and 12B, the additional substrate pads 22-5 and additional substrate pads 22-5' are aligned in the Y-axis direction and are not space apart from each other in the X-axis direction.

The semiconductor package PK5 may include a molding layer 36 that seals the first through fourth chips 16, 20, 38, and 40, the first through fourth bonding pads 24, 28, 44, and 48, the first through third dummy bonding pads 26, 42, and 46, the bonding wires 30, 32, 34, 50, 52, 54, and 56, and the additional bonding wires 30-5, 34-5, 66, and 68.

By including the additional first bonding pads 24-5, the additional second bonding pads 28-5, the additional third bonding pads 44-5, the additional fourth bonding pads 48-5, and the additional bonding wires 30-5, 34-5, 66, and 68 as described above, the semiconductor package PK5 may easily electrically connect the first through fourth chips 16, 20, 38, and 40 to the package substrate 10.

Figure 14:
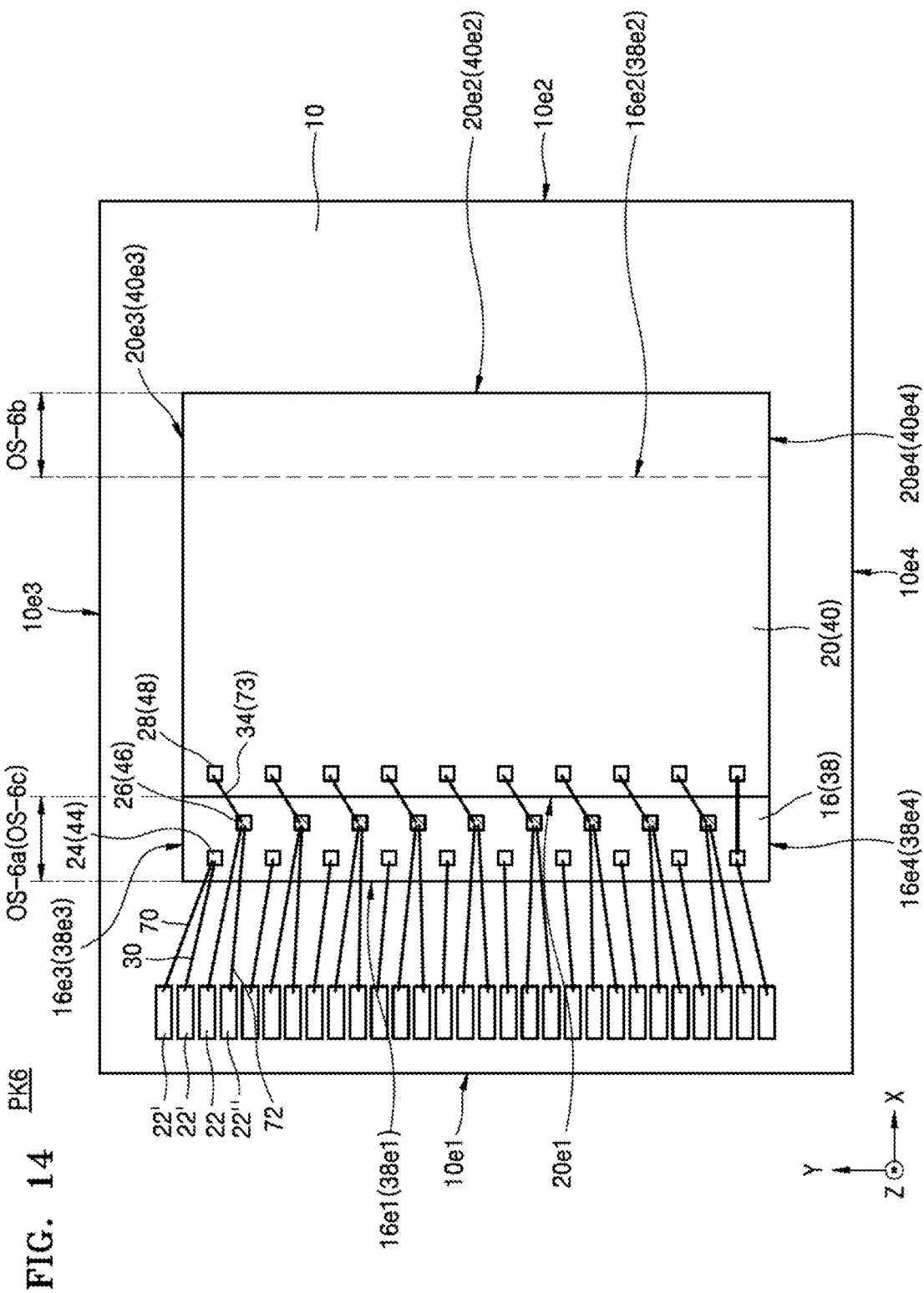
FIG. 14 is a plan view of a semiconductor package according to an embodiment of the inventive concept.
Figure 15:
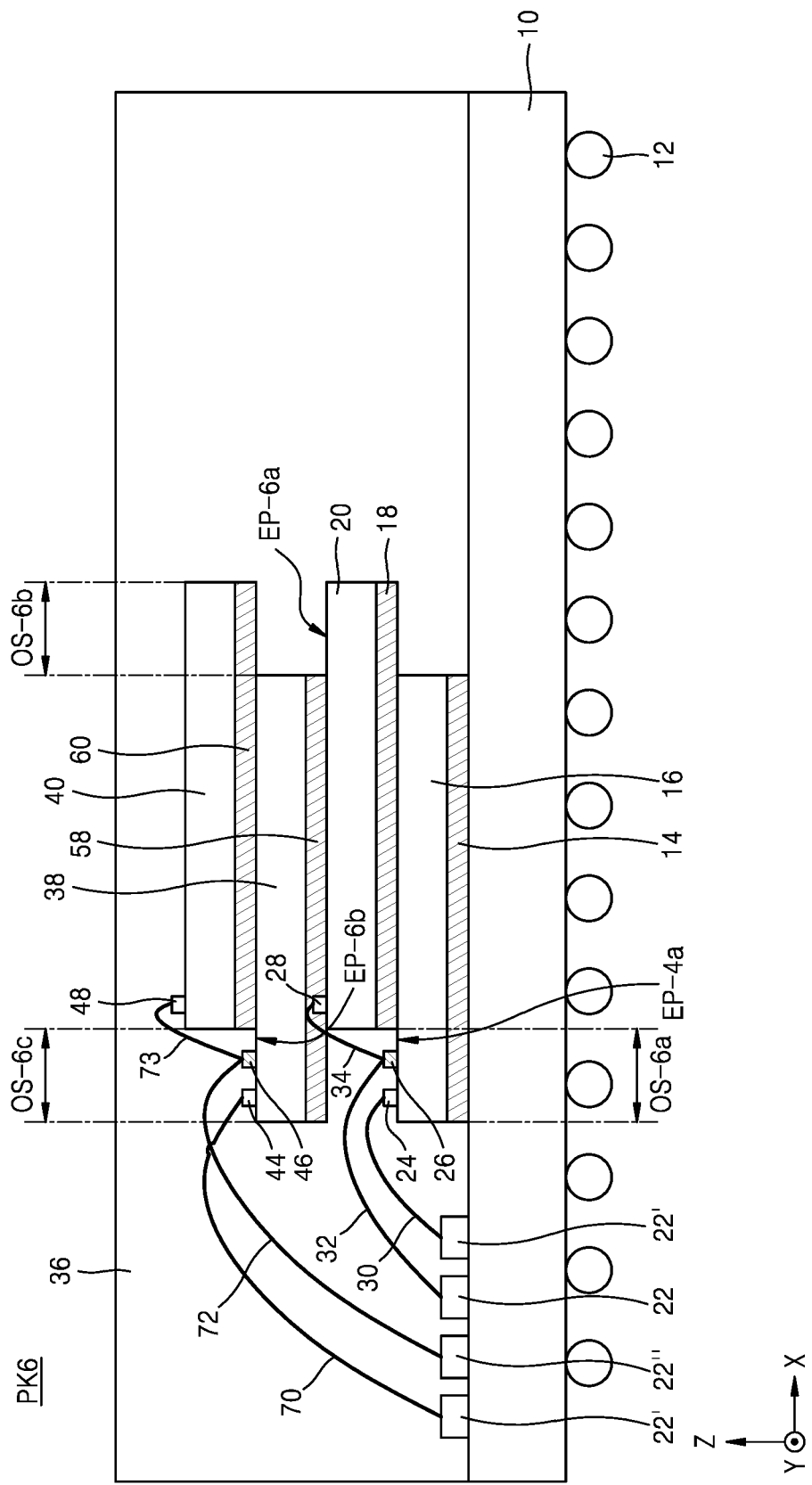
FIG. 15 is a cross-sectional view of the semiconductor package of FIG. 14 according to an embodiment of the inventive concept.

FIG. 14 is a plan view for explaining a semiconductor package PK6 according to an embodiment of the inventive concept, and FIG. 15 is a cross-sectional view of the semiconductor package PK6 of FIG. 14.

In detail, the semiconductor package PK6 may be similar to as the semiconductor package PK4 of FIGS. 10A, 10B, and 11 except that the second chip 20, the third chip 38, and the fourth chip 40 are stacked on the first chip 16 in a zigzag manner.

In FIGS. 14 and 15, reference numerals similar to or the same as FIGS. 10A, 10B, and 11 indicate the same or similar members. Descriptions of FIGS. 14 and 15 identical to those given above with reference to FIGS. 10A, 10B, and 11 are omitted or briefly given below.

The semiconductor package PK6 may include a package substrate 10, and substrate pads 22, 22', and 22" provided on one side portion of the package substrate 10. The semiconductor package PK6 may further include a first chip 16, a second chip 20, a third chip 38, and a fourth chip 40.

The first chip 16 may be mounted on the package substrate 10. The second chip 20, the third chip 38, and the fourth chip 40 may be stacked on the first chip 16 in an offset, zigzag manner.

In more detail, the second chip 20 may be offset on the first chip 16 by a first offset length OS-6a in the X-axis direction toward a first side of the semiconductor package PK6. A first exposure region EP-4a exposing a portion of the surface of the first chip 16 may be provided according to an offset stacking manner.

The third chip 38 may be offset on the second chip 20 by a second offset length OS-6b in the X-axis direction toward a second side of the semiconductor package PK6 opposite the first side. A second exposure region EP-6a exposing a portion of the surface of the second chip 20 may be provided according to an offset stacking manner. The second exposure region EP-6a may be located opposite to the first exposure region EP-4a in the X-axis direction.

The fourth chip 40 may be offset on the third chip 38 by a third offset length OS-6c in the X-axis direction. A third exposure region EP-6b exposing a portion of the surface of the third chip 38 may be provided according to an offset stacking manner. The third exposure region EP-6b may be located opposite to the second exposure region EP-6a in the X-axis direction. As such, in the semiconductor package PK6, the first chip 16, the second chip 20, the third chip 38, and the fourth chip 40 may be stacked on the first chip 16 in an offset manner, for example, in a zigzag manner.

The semiconductor package PK6 may include a plurality of first bonding pads 24, a plurality of first dummy bonding pads 26, and a plurality of second bonding pads 28. The semiconductor package PK6 may further include a plurality of third bonding pads 44, a plurality of third dummy bonding pads 46, and a plurality of fourth bonding pads 48.

The first bonding pads 24 and the first dummy bonding pads 26 may be located on the first exposure region EP-4a. The third bonding pads 44 and the third dummy bonding pads 46 may be located on the third exposure region EP-6b. The fourth bonding pads 48 may be located on the surface of a first side portion of the fourth chip 40.

The semiconductor package PK6 may include bonding wires 30, 32, 34, 70, 72, and 73. The bonding wires 30, 32, 34, 70, 72, and 73 may electrically connect the first chip 16, the second chip 20, the third chip 38, and the fourth chip 40 to the package substrate 10.

The bonding wires 30, 32, and 34 may include first bonding wires 30 for connecting the first bonding pads 24 of the first chip 16 to the substrate pads 22', second bonding wires 32 for connecting the first dummy bonding pads 26 of the first chip 16 to the substrate pads 22, and third bonding wires 34 for connecting the second bonding pads 28 of the second chip 20 to the first dummy bonding pads 26 of the first chip 16.

The bonding wires 70, 72, and 73 may include bonding wires 70 for connecting the third bonding pads 44 of the third chip 38 to the substrate pads 22', bonding wires 72 for connecting the third dummy bonding pads 46 of the third chip 38 to the substrate pads 22", and bonding wires 73 for connecting the fourth bonding pads 48 of the fourth chip 40 to the third dummy bonding pads 46 of the third chip 38. For convenience of explanation only, FIG. 15 illustrates that the substrate pad 22, the substrate pad 22', and the substrate pad 22" are spaced apart from one another in the X-axis direction, but the embodiment of FIGS. 14 and 15, these pads are aligned in the Y-axis direction and are not spaced apart from one another in the X-axis direction.

The semiconductor package PK6 may include a molding layer 36 that seals the first through fourth chips 16, 20, 38, and 40, the first through fourth bonding pads 24, 28, 44, and 48, the first through third dummy bonding pads 26, 42, and 46, and the bonding wires 30, 32, 34, 70, 72, and 73.

As such, the semiconductor package PK6 may stack the first through fourth chips 16, 20, 38, and 40 in an offset manner, for example, in a zig-zag manner. In addition, the semiconductor package PK6 may reduce respective lengths of the bonding wires 30, 32, 34, 70, 72, and 73 by electrically connecting the first through fourth chips 16, 20, 38, and 40 to the package substrate 10 by using the first through third dummy bonding pads 26, 42, and 46.

Figure 16:
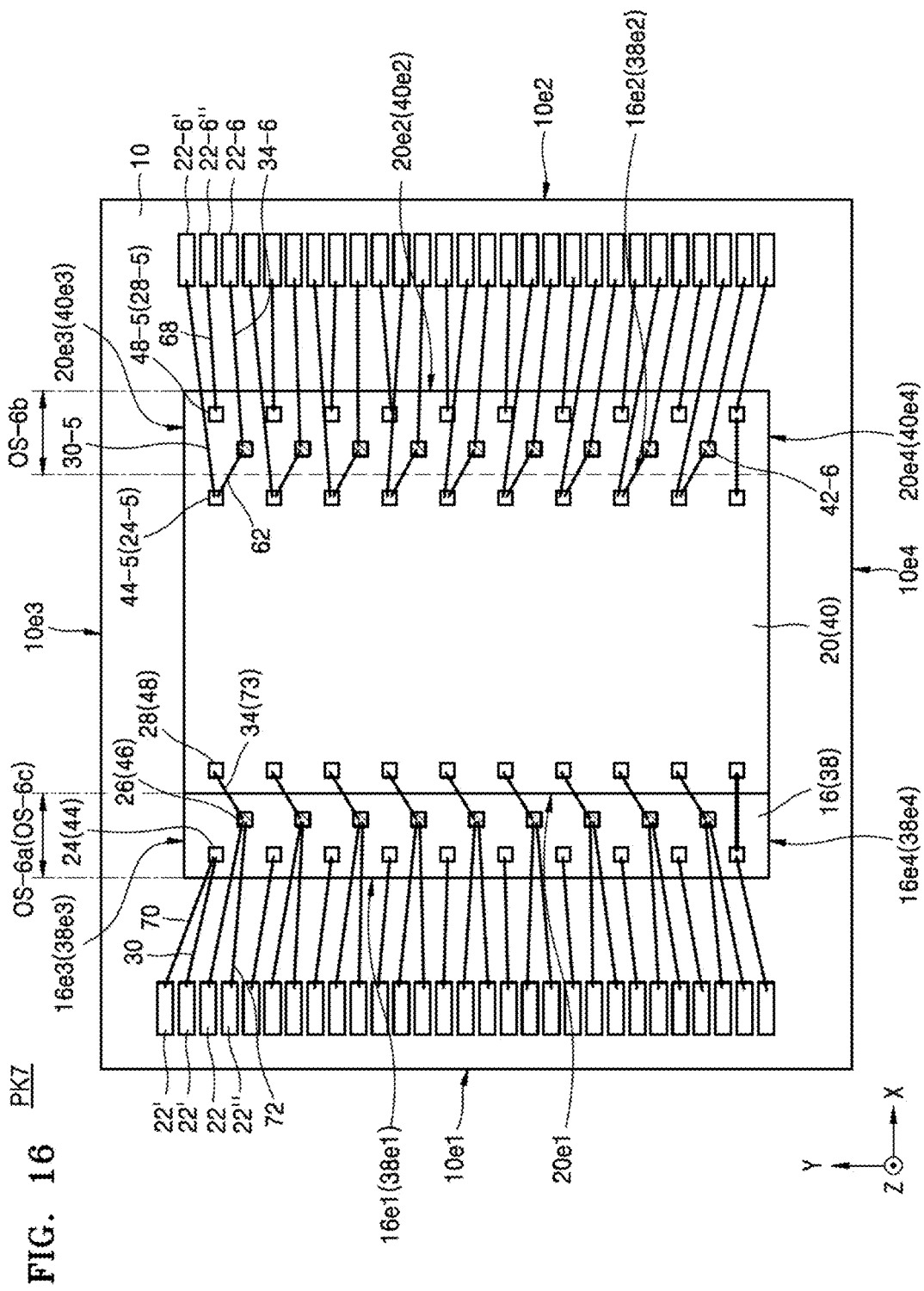
FIG. 16 is a plan view of a semiconductor package according to an embodiment of the inventive concept.
Figure 17:
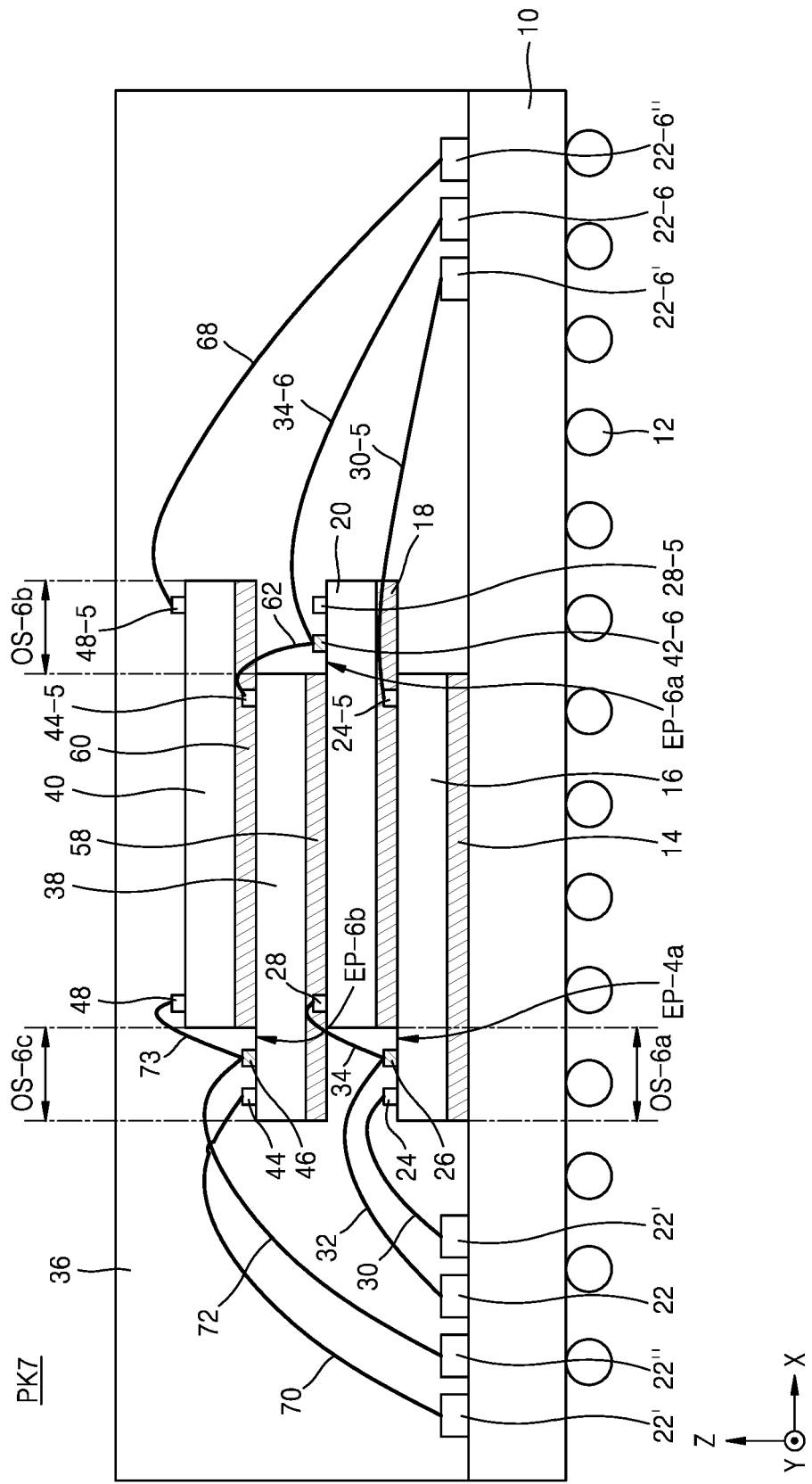
FIG. 17 is a cross-sectional view of the semiconductor package of FIG. 16 according to an embodiment of the inventive concept.

FIG. 16 is a plan view for explaining a semiconductor package PK7 according to an embodiment of the inventive concept, and FIG. 17 is a cross-sectional view of the semiconductor package PK7 of FIG. 16.

In detail, the semiconductor package PK7 may be similar to the semiconductor package PK6 of FIGS. 14 and 15 except that additional first bonding pads 24-5, additional second dummy bonding pads 42-6, additional second bonding pads 28-5, additional third bonding pads 44-5, additional fourth bonding pads 48-5, and additional bonding wires 30-5, 34-6, 62, and 68 are further included.

In FIGS. 16 and 17, reference numerals similar to or the same as FIGS. 14 and 15 indicate the same or similar members. Descriptions of FIGS. 16 and 17 identical to those given above with reference to FIGS. 14 and 15 are omitted or briefly given below.

The semiconductor package PK7 may include the package substrate 10, substrate pads 22, 22', and 22" provided on one side portion of the package substrate 10, and additional substrate pads 22-6, 22-6', and 22-6" provided on the other side portion of the package substrate 10. The additional substrate pads 22-6, 22-6', and 22-6" may be located adjacent to a second edge portion 10e2, which is the other side of the package substrate 10. The additional substrate pads 22-6, 22-6', and 22-6" may be referred to as additional substrate bonding pads. The additional substrate pads 22-6, 22-6', and 22-6" may be included in plural, and may be located apart from each other in the Y-axis direction.

The semiconductor package PK7 may include a first chip 16, a second chip 20, a third chip 38, and a fourth chip 40. The first chip 16 may be mounted on the package substrate 10. The second chip 20, the third chip 38, and the fourth chip 40 may be stacked on the first chip 16 in an offset manner, for example, in a zigzag manner. The first chip 16, the second chip 20, the third chip 38, and the fourth chip 40 have been described above, and thus, repeated descriptions thereof are omitted here.

The semiconductor package PK7 may include a plurality of first bonding pads 24, a plurality of first dummy bonding pads 26, a plurality of additional first bonding pads 24-5, a plurality of additional second bonding pads 28, a plurality of second dummy bonding pads 42-6, and a plurality of additional second bonding pads 28-5.

The semiconductor package PK7 may further include a plurality of third bonding pads 44, a plurality of third dummy bonding pads 46, a plurality of additional third bonding pads 44-5, a plurality of fourth bonding pads 48, and a plurality of additional fourth bonding pads 48-5. The first bonding pads 24, the first dummy bonding pads 26, the second bonding pads 28, the third bonding pads 44, the third dummy bonding pads 46, and the fourth bonding pads 48 have been described above, and thus, repeated descriptions thereof are omitted here.

The additional second dummy bonding pads 42-6 and the additional second bonding pads 28-5 may be located on a second exposure region EP-6a. The plurality of additional third bonding pads 44-5 and the additional fourth bonding pads 48-5 may be located on the respective surfaces of respective other-side portions of the third chip 38 and the fourth chip 40, respectively.

The semiconductor package PK7 may include bonding wires 30, 32, 34, 70, 72, and 73 and additional bonding wires 30-5, 34-6, 62, and 68. The bonding wires 30, 32, 34, 70, 72, and 73 and the additional bonding wires 30-5, 34-6, 62, and 68 may electrically connect the first chip 16, the second chip 20, the third chip 38, and the fourth chip 40 to the package substrate 10.

The bonding wires 30, 32, 34, 50, 70, 72, and 73 have been described above, and thus, repeated descriptions thereof are omitted here. The additional bonding wires 30-5, 34-6, 62, and 68 include additional second bonding wires 30-5 for connecting the additional first bonding pads 24-5 of the first chip 16 to the additional substrate pads 22-6', and additional second bonding wires 34-6 for connecting the additional second bonding pads 42-6 of the second chip 20 to the additional substrate pads 22-6.

The additional bonding wires 30-5, 34-6, 62, and 68 may include additional third bonding wires 62 for connecting the additional third bonding pads 44-5 of the third chip 38 to the additional second dummy bonding pads 42-6 of the second chip 20, and additional fourth bonding wires 68 for connecting the additional fourth bonding pads 48-5 of the fourth chip 40 to the additional substrate pads 22-6". For convenience of explanation only, FIG. 17 illustrates that the substrate pad 22-6, the substrate pad 22-6', and the substrate pad 22-6" are spaced apart from one another in the X-axis direction.

The semiconductor package PK7 may include a molding layer 36 that seals the first through fourth chips 16, 20, 38, and 40, the first through fourth bonding pads 24, 28, 44, and 48, the first and third dummy bonding pads 26 and 46, the additional second dummy bonding pads 42-6, the bonding wires 30, 32, 34, 70, 72, and 73, and the additional bonding wires 30-5, 34-6, 62, and 68.

As such, the semiconductor package PK7 may stack the first through fourth chips 16, 20, 38, and 40 in an offset manner, for example, in a zig-zag manner. In addition, the semiconductor package PK7 may reduce respective lengths of the bonding wires 30-5, 34-6, 62, and 68 by electrically connecting the first through fourth chips 16, 20, 38, and 40 to the package substrate 10 by using the first and second dummy bonding pads 26 and 46 and the additional second dummy bonding pads 42-6.

Figure 18:
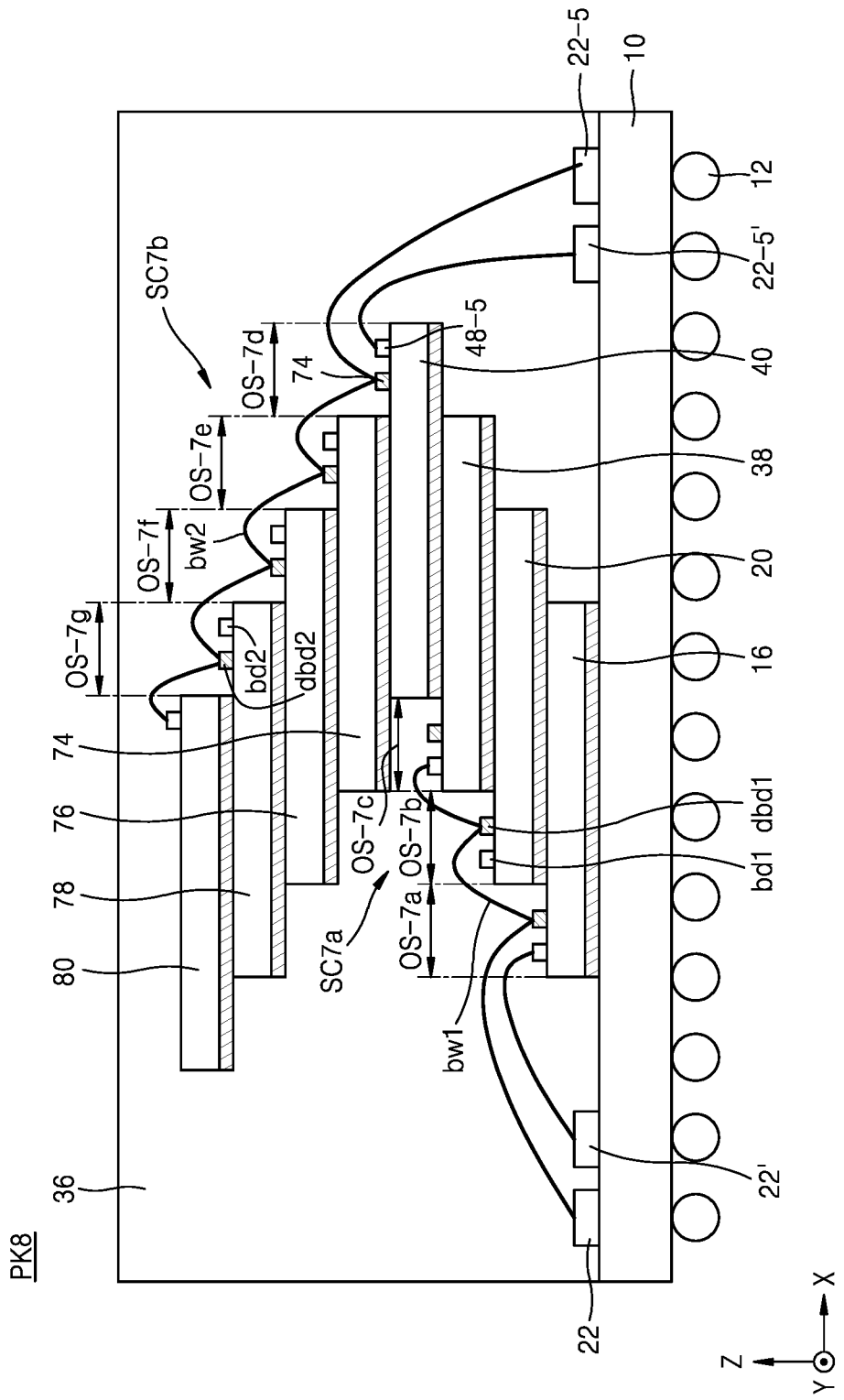
FIG. 18 is a cross-sectional view of a semiconductor package according to an embodiment of the inventive concept.

FIG. 18 is a cross-sectional view of a semiconductor package PK8 according to an embodiment of the inventive concept.

In detail, the semiconductor package PK8 may be the same as the semiconductor package PK4 of FIGS. 10A, 10B, and 11 except that a fifth chip 74, a sixth chip 76, a seventh chip 78, and an eighth chip 80 are further stacked on the fourth chip 40 in an offset manner.

In FIG. 18, reference numerals similar to or the same as FIGS. 10A, 10B, and 11 indicate the same or similar members. Descriptions of FIG. 18 identical to those given above with reference to FIGS. 10A, 10B, and 11 are omitted or briefly given below.

The semiconductor package PK8 may include the package substrate 10, substrate pads 22 and 22' provided on one side portion of the package substrate 10, and additional substrate pads 22-5 and 22-5' provided on the other side portion of the package substrate 10. The semiconductor package PK8 may further include the second chip 20, the third chip 38, and the fourth chip 40 stacked on the first chip 16, and the fifth chip 74, the sixth chip 76, the seventh chip 78, and the eighth chip 80 stacked on the fourth chip 40. The first chip 16 may be referred to as a first base chip. The second chip 20, the third chip 38, and the fourth chip 40 may be referred to as first stacked chips. The second chip 20, the third chip 38, and the fourth chip 40 may be referred to as a first stacked chip group SC7a.

The fourth chip 40 may be referred to as a second base chip. The fifth chip 74, the sixth chip 76, the seventh chip 78, and the eighth chip 80 may be referred to as second stacked chips. The fifth chip 74, the sixth chip 76, the seventh chip 78, and the eighth chip 80 may be referred to as a second stacked chip group SC7b.

In more detail, the second chip 20, the third chip 38, and the fourth chip 40 are stacked on the first chip 16 mounted on the package substrate 10 in an offset manner. The second chip 20, the third chip 38, and the fourth chip 40 are stacked on the first chip 16 in a cascade type, namely, in a staircase type, particularly a staircase rising in a direction toward a first side of the semiconductor substrate 10.

The second chip 20 may be offset on the first chip 16 by a first offset length OS-7a in the X-axis direction. The first offset length OS-7a may correspond to the first offset length OS of FIGS. 10A, 10B, and 11. The third chip 38 may be offset on the second chip 20 by a second offset length OS-7b in the X-axis direction.

The second offset length OS-7b may correspond to the second offset length OS-4a of FIGS. 10A, 10B, and 11. The fourth chip 40 may be offset on the third chip 38 by a third offset length OS-7c in the X-axis direction. The third offset length OS-7c may correspond to the third offset length OS-4b of FIGS. 10A, 10B, and 11.

The fifth chip 74, the sixth chip 76, the seventh chip 78, and the eighth chip 80 are stacked on the fourth chip 40 in an offset manner. The fifth chip 74, the sixth chip 76, the seventh chip 78, and the eighth chip 80 are stacked on the fourth chip 40 in a cascade type, namely, in a staircase type particularly a staircase rising in a direction away from the first side of the semiconductor substrate 10.

The fifth chip 74 may be offset by a fourth offset length OS-7d in the X-axis direction on the fourth chip 40. The sixth chip 76 may be offset by a fifth offset length OS-7e in the X-axis direction on the fifth chip 74. The seventh chip 78 may be offset by a sixth offset length OS-7f in the X-axis direction on the sixth chip 76. The eighth chip 80 may be offset by a seventh offset length OS-7g in the X-axis direction on the seventh chip 78.

The semiconductor package PK8 may include a plurality of first group bonding pads bd1, a plurality of first group dummy bonding pads dbd1, a plurality of second group bonding pads bd2, and a plurality of second group dummy bonding pads dbd2.

The semiconductor package PK8 may include first group bonding wires bw1 and second group bonding wires bw2. The first group bonding wires bw1 may electrically connect the plurality of first group bonding pads bd1 and the plurality of first group dummy bonding pads dbd1 to the substrate pads 22 and 22' of the package substrate 10. The second group bonding wires bw2 may electrically connect the plurality of second group bonding pads bd2 and the plurality of second group dummy bonding pads dbd2 to the additional substrate pads 22-5 and 22-5' of the package substrate 10.

The semiconductor package PK8 may include a molding layer 36 that seals the first through eighth chips 16, 20, 38, 40, 74, 76, 78, and 80, the first and second group bonding pads bd1 and bd2, the first and second group dummy bonding pads dbd1 and dbd2, and the first and second group bonding wires bw1 and bw2.

As such, the semiconductor package PK8 may stack the first through eighth chips 16, 20, 38, 40, 74, 76, 78, and 80 in an offset manner, for example, in a cascade type. In addition, the semiconductor package PK7 may reduce respective lengths of the first and second group bonding wires bw1 and bw2 by using the first and second group dummy bonding pads dbd1 and dbd2.

Figure 19:
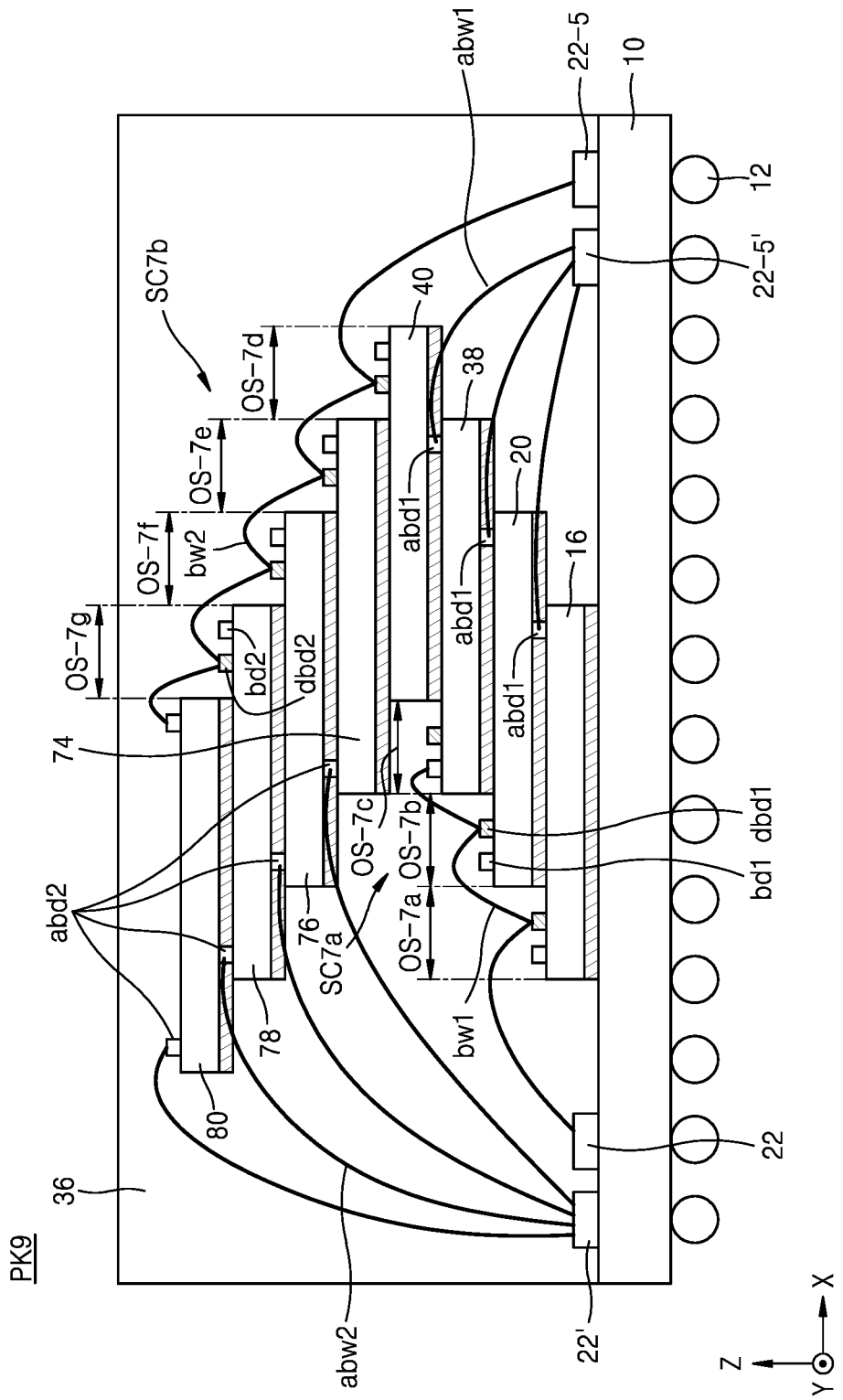
FIG. 19 is a cross-sectional view of a semiconductor package according to an embodiment of the inventive concept.

FIG. 19 is a cross-sectional view of a semiconductor package PK9 according to an embodiment of the inventive concept.

In detail, the semiconductor package PK9 may be similar to the semiconductor package PK8 of FIG. 18 except that additional first and second group bonding pads abd1 and abd2 and additional first and second bonding wires abw1 and abw2 are further included. In FIG. 19, reference numerals similar to or the same as FIG. 18 indicate the same or similar members. A description of FIG. 19 which is the same as that of FIG. 1 may be given briefly or omitted herein.

In the semiconductor package PK9, the second chip 20, the third chip 38, and the fourth chip 40 are stacked on the first chip 16 mounted on the package substrate 10 in an offset manner. The second chip 20, the third chip 38, and the fourth chip 40 are stacked on the first chip 16 in the X-axis direction in a cascade type, namely, in a staircase type. The additional first group bonding pads abd1 may be located on respective surfaces of the first chip 16, the second chip 20, the third chip 38, and the fourth chip 40.

In the semiconductor package PK9, the fifth chip 74, the sixth chip 76, the seventh chip 78, and the eighth chip 80 are stacked on the fourth chip 40 in an offset manner. The fifth chip 74, the sixth chip 76, the seventh chip 78, and the eighth chip 80 are stacked on the fourth chip 40 in the −X-axis direction in a cascade type, namely, in a staircase type. The additional second group bonding pads abd2 may be located on respective surfaces of the fifth chip 74, the sixth chip 76, the seventh chip 78, and the eighth chip 80.

The semiconductor package PK9 may include additional first and second group bonding wires abw1 and abw2. The additional first group bonding wires abw1 may electrically connect the additional first group bonding pads abd1 to the additional substrate pads 22-5 and 22-5' of the package substrate 10. The additional second group bonding wires abw2 may electrically connect the additional second group bonding pads abd2 to the substrate pads 22 and 22' of the package substrate 10.

By including the additional first and second group bonding pads abd1 and abd2 and the additional first and second group bonding wires abw1 and abw2 as described above, the semiconductor package PK9 may easily electrically connect the first through eighth chips 16, 20, 38, 40, 74, 76, 78, and 80 to the package substrate 10.

Figure 20:
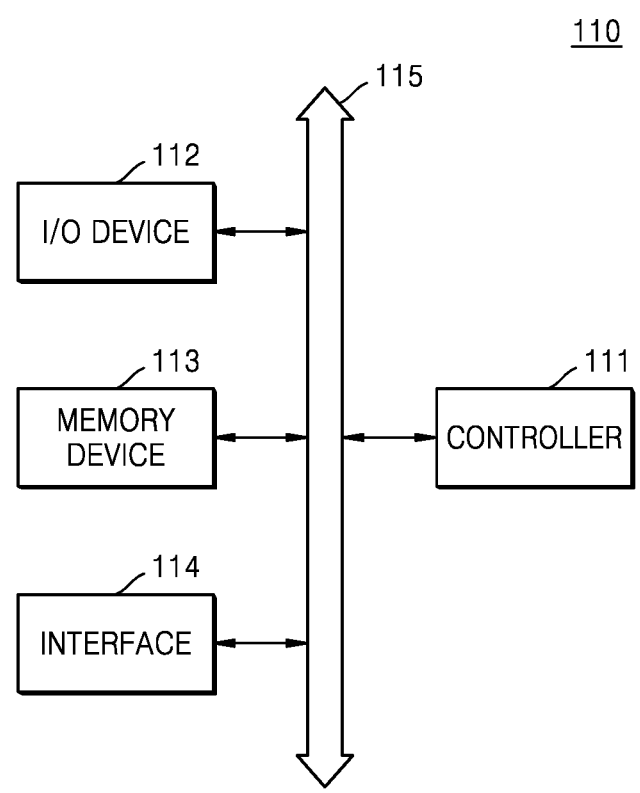
FIG. 20 is a schematic block diagram of a memory system including a semiconductor package according to an embodiment of the inventive concept.

FIG. 20 is a schematic block diagram of a memory system 110 including a semiconductor package according to an embodiment of the inventive concept.

In detail, the memory system 110 is applicable to personal digital assistants (PDA), portable computers, web tablets, wireless phones, mobile phones, digital music players, memory cards, or all devices capable of transmitting and/or receiving information in a wireless environment.

The memory system 110 includes a controller 111, an input/output (I/O) device 112 (such as, a key pad, a key board, and a display), a memory device 113, an interface 114, and a bus 115. The memory device 113 and the interface 114 communicates with each other via the bus 115.

The controller 111 includes at least one microprocessor, a digital signal processor, a microcontroller, or other processing devices similar to these devices. The memory device 113 may be used to store commands executed by the controller 111. The I/O device 112 may receive data or a signal from the outside of the memory system 110 or output data or a signal to the outside of the memory system 110. For example, the I/O device 112 may include a keyboard, a keypad, or a display.

The memory device 113 and the controller 111 may include the semiconductor packages PK1 through PK9 according to embodiments of the inventive concept. The memory device 113 may further include different types of memories, volatile memories that can be accessed at any time, and other various types of memories. The interface 114 transmits data to a communication network or receives data from the communication network.

Figure 21:
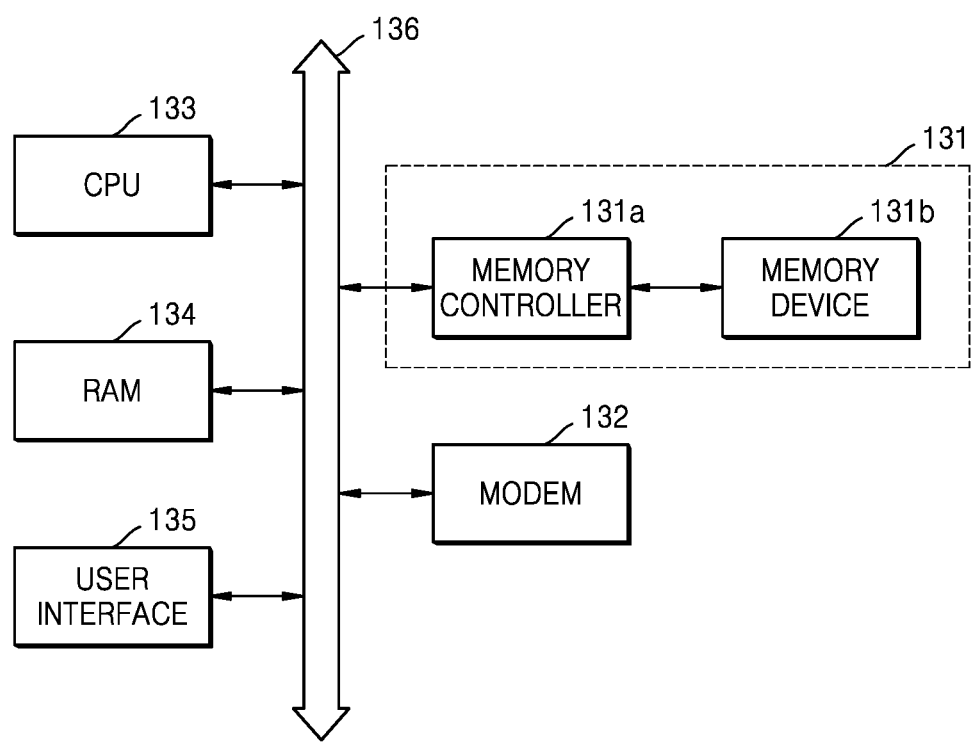
FIG. 21 is a schematic block diagram of an information processing system including a semiconductor package according to an embodiment of the inventive concept.

FIG. 21 is a schematic block diagram of an information processing system 130 including a semiconductor package according to an embodiment of the inventive concept.

In detail, the information processing system 130 may be used in mobile devices or desktop computers. The information processing system 130 may include a memory system 131 including a memory controller 131a and a memory device 131b.

The information processing system 130 includes a MOdulator and DEModulator (MODEM) 132, a CPU 133, a RAM 134, and a user interface 135 all electrically connected to a system bus 136. The memory system 131 stores data processed by the CPU 133 or data input from the outside.

The memory system 131 including the memory controller 131a and the memory device 131b, the MODEM 132, the CPU 133, and the RAM 134 may include the semiconductor packages PK1 through PK9 according to embodiments of the inventive concept.

The memory system 131 may be formed using a solid state driver. In this case, the information processing system 130 may stably store large-capacity data in the memory system 131. With an increase in reliability, the memory system 131 may save resources required for error correction, and thus may provide a high-speed data exchange function to the information processing system 130. Although not shown in FIG. 21, the information processing system 130 may be further provided with an application chipset, a camera image signal processor (ISP), an I/O device, etc.

While the inventive concept has been particularly shown and described with reference to embodiments thereof, it will be understood that various changes in form and details may be made therein without departing from the spirit and scope of the following claims.

What is claimed is:

1. A semiconductor package comprising:
   a package substrate;
   a plurality of first substrate pads on a top surface of the package substrate at a first side portion of the package substrate;
   a base chip on the package substrate;
   one or more stacked chips sequentially stacked in a step-wise manner on the base chip, wherein one or more exposure regions exposing portions of respective surfaces of the base chip and the stacked chips are provided due to the step-wise stacking;
   a plurality of first bonding pads on a first portion of each of the exposure regions, each first portion being adjacent to a first edge of a respective chip of the base chip and the stacked chips, wherein the plurality of first bonding pads comprise upper bonding pads of bonding wire-connected pads of the stacked chips;
   a plurality of second bonding pads on a second portion of each of the exposure regions, the second portion of each exposure region further from the first edge of each respective chip than the first portion of each exposure region, wherein the plurality of second bonding pads comprise lower bonding pads of bonding wire-connected pads, located at a lower height than upper bonding pads to which they are connected; and
   a plurality of bonding wires electrically connecting the upper bonding pads to the first substrate pads via the lower bonding pads.

2. The semiconductor package of claim 1, wherein:
   for each chip of the base chip and the stacked chips, the first bonding pads are aligned and spaced apart from each other in a first row extending in a first horizontal direction along the first edge of the chip,
   for each chip of the base chip and the stacked chips, the second bonding pads are aligned and spaced apart from each other in a second row extending in the first horizontal direction along the first edge of the chip; and
   the second row is spaced apart from the first row in a second horizontal direction perpendicular to the first horizontal direction.

3. The semiconductor package of claim 2, wherein each bonding pad of the second bonding pads is arranged between two adjacent bonding pads of the first bonding pads in the first horizontal direction, and are not aligned with the first bonding pads in the second horizontal direction.

4. The semiconductor package of claim 2, wherein each bonding pad of the second bonding pads is arranged between two adjacent first bonding pads of the first bonding pads in the first horizontal direction, and at least some of the second bonding pads arranged between two adjacent first bonding pads of the first bonding pads in the first horizontal direction are biased toward one of the two adjacent first bonding pads in the first horizontal direction.

5. The semiconductor package of claim 1, wherein:
the exposure regions are adjacent to respective first edges of chips of the base chip and the stacked chips and expose the portions of the respective surfaces of the base chip and the stacked chips, and
the semiconductor package further includes additional exposure regions adjacent to respective second edges of the base chip and the stacked chips opposite the first edges, and exposing portions of the respective surfaces of the base chip and the stacked chips.

6. The semiconductor package of claim 1, further comprising:
a plurality of second substrate pads on a top surface of the package substrate at a second side portion of the package substrate; and
a plurality of third bonding pads on respective portions of the base chip and the stacked chips that are adjacent to respective second edges of the base chip and the stacked chips,
wherein the third bonding pads are electrically connected to the second substrate pads by using a plurality of additional bonding wires.

7. The semiconductor package of claim 1, wherein the stacked chips are stacked on the base chip in a cascade manner as a staircase rising in a direction toward a first side of the package substrate or a zigzag manner in which at least two chips of the stacked chips rise in a direction toward the first side of the package substrate and at least two chips of the stacked chips rise in a direction toward a second side of the package substrate opposite the first side.

8. The semiconductor package of claim 1, wherein the stacked chips include a first stacked chip group and a second stacked chip group, the first stacked chip group is offset stacked on the base chip in a first direction, and the second stacked chip group is offset stacked on the first stacked chip group in a second direction opposite to the first direction.

9. The semiconductor package of claim 1, wherein a width of each of the stacked chips is equal to or less than a width of the base chip.

10. A semiconductor package comprising:
a package substrate having a first side portion adjacent to a first edge, and a second side portion adjacent to a second edge opposite the first edge;
a plurality of first substrate pads on the package substrate at the first side portion of the package substrate;
a first chip on the package substrate;
a second chip stacked on the first chip in a step-wise manner to result in a first exposure region exposing a portion of a surface of the first chip with respect to the second chip due to the step-wise stacking, the first exposure region being adjacent to a first edge of the first chip;
a plurality of first bonding pads on a first portion of the first exposure region, the first portion of the first exposure region being adjacent to the first edge of the first chip;
a plurality of second bonding pads on a second portion of the first exposure region, the second portion of the first exposure region further from the first edge of the first chip than the first portion of the first exposure region is to the first edge of the first chip, the plurality of second bonding pads being electrically insulated from any circuit components in the first chip;
a plurality of third bonding pads on a surface of the second chip; and
a plurality of bonding wires electrically connecting the third bonding pads to the first substrate pads via the second bonding pads.

11. The semiconductor package of claim 10, wherein:
the first bonding pads are aligned with each other and are apart from each other in a first row extending in a first direction along the first edge of the first chip,
the second bonding pads are aligned with each other and are apart from each other in a second row extending in the first direction, and
the second row is spaced apart from the first row in a second direction perpendicular to the first direction.

12. The semiconductor package of claim 11, wherein each bonding pad of the plurality of second bonding pads is arranged between two adjacent first bonding pads of the first bonding pads when viewed from the second direction.

13. The semiconductor package of claim 11, wherein each bonding pad of the plurality of second bonding pads is arranged between two adjacent first bonding pads of the first bonding pads when viewed from the second direction, and each of the second bonding pads arranged between two adjacent first bonding pads is biased toward one of the two adjacent first bonding pads in the first direction.

14. The semiconductor package of claim 10, wherein:
the semiconductor package further includes a second exposure region adjacent to a second edge of the first chip and exposing a portion of the surface of the first chip.

15. The semiconductor package of claim 14, further comprising:
a plurality of second substrate pads on a second side portion of the package substrate; and
a plurality of fourth bonding pads on the second exposure region,
wherein the fourth bonding pads are electrically connected to the second substrate pads by using a plurality of additional bonding wires.

16. The semiconductor package of claim 10, further comprising:
a plurality of second substrate pads on a second side portion of the package substrate; and
a plurality of fourth bonding pads on a portion of the first chip that is adjacent to a second edge of the first chip opposite the first edge of the first chip,
wherein the fourth bonding pads are electrically connected to the second substrate pads by using a plurality of additional bonding wires.

17. The semiconductor package of claim 10, wherein the second bonding pads are first relay bonding pads, and further comprising:
a third chip stacked on the second chip in a step-wise manner to result in a second exposure region exposing a portion of a surface of the second chip with respect to the third chip due to the step-wise stacking;
a plurality of second relay bonding pads on the surface of the second chip such that the plurality of third bonding pads on the surface of the second chip and the plurality of second relay bonding pads on the surface of the second chip are on first and second portions of the second exposure region that are respectively closer to and further from a first edge of the second chip;

a fourth chip stacked on the third chip in a step-wise manner to result in a third exposure region exposing a portion of a surface of the third chip with respect to the fourth chip due to the step-wise stacking;

a plurality of fourth bonding pads and a plurality of third relay bonding pads on first and second portions of the third exposure region that are respectively closer to and further from a first edge of the third chip;

a plurality of fifth bonding pads on a surface of the fourth chip adjacent to a first edge of the fourth chip; and a plurality of bonding wires electrically connecting the fifth bonding pads to the first substrate pads, such that each fifth bonding pad is connected to a respective substrate pad via a respective third relay bonding pad, a respective second relay bonding pad, and a respective first relay bonding pad.

18. The semiconductor package of claim 17, wherein:
the third bonding pads are aligned with each other and are apart from each other in a first row extending in a first direction along the first edge of the second chip, and the second relay bonding pads are aligned with each other and are apart from each other in in a second row, the second row extending in the first direction and adjacent to and spaced apart from the first row in a second direction perpendicular to the first direction, and
the fourth bonding pads are aligned with each other and are apart from each other in a third row extending in the first direction along a first edge of the third chip, and the third relay bonding pads are aligned with each other and are apart from each other in in a fourth row, the fourth row extending in the first direction and adjacent to and spaced apart from the third row in the second direction.

19. The semiconductor package of claim 18, wherein:
when viewed from the second direction, each of the first relay bonding pads is arranged between two adjacent bonding pads of the first bonding pads, each of the second relay bonding pads is arranged between two adjacent bonding pads of the third bonding pads, and each of the third relay bonding pads is arranged between two adjacent bonding pads of the fourth bonding pads, and
the first relay bonding pads, the second relay bonding pads, and the third relay bonding pads are not aligned with the first bonding pads, the third bonding pads, or the fourth bonding pads, respectively, in either of the first direction or the second direction.

20. The semiconductor package of claim 17, further comprising:
a plurality of additional substrate pads on a second side portion of the package substrate; and
a plurality of additional bonding pads on respective portions of the first, second, third, and fourth chips that are adjacent to respective second edges of the first, second, third, and fourth chips,
wherein the additional bonding pads are electrically connected to the additional substrate pads by using a plurality of additional bonding wires.

* * * * *